United States Patent
Goto

(10) Patent No.: US 10,326,413 B2
(45) Date of Patent: Jun. 18, 2019

(54) POWER AMPLIFICATION CIRCUIT

(71) Applicant: Murata Manufacturing Co., Ltd., Kyoto-fu (JP)

(72) Inventor: Satoshi Goto, Nagaokakyo (JP)

(73) Assignee: Murata Manufacturing Co., Ltd., Kyoto-fu (JP)

(*) Notice: Subject to any disclaimer, the term of this patent is extended or adjusted under 35 U.S.C. 154(b) by 0 days.

(21) Appl. No.: 16/011,803

(22) Filed: Jun. 19, 2018

(65) Prior Publication Data

US 2018/0351518 A1 Dec. 6, 2018

Related U.S. Application Data

(62) Division of application No. 15/430,890, filed on Feb. 13, 2017, now Pat. No. 10,027,291.

(30) Foreign Application Priority Data

Mar. 31, 2016 (JP) ................. 2016-071197

(51) Int. Cl.
  H03F 3/04  (2006.01)
  H03F 1/56  (2006.01)
  H03F 3/21  (2006.01)
  H03F 3/195 (2006.01)
  H03F 3/24  (2006.01)

(52) U.S. Cl.
  CPC ............ *H03F 1/565* (2013.01); *H03F 3/195* (2013.01); *H03F 3/21* (2013.01); *H03F 3/245* (2013.01); *H03F 2200/108* (2013.01); *H03F 2200/18* (2013.01); *H03F 2200/222* (2013.01); *H03F 2200/318* (2013.01); *H03F 2200/387* (2013.01);

(Continued)

(58) Field of Classification Search
  CPC . H03F 1/565; H03F 3/21; H03F 3/245; H03F 3/195
  USPC .................................... 330/302, 296
  See application file for complete search history.

(56) References Cited

U.S. PATENT DOCUMENTS 6,441,687 B1   8/2002 Apel
9,503,025 B2 * 11/2016 Cao ................. H03F 1/0222
              (Continued)

FOREIGN PATENT DOCUMENTS

| JP | 2004-111941 A | 4/2004 |
| JP | 2011-259215 A | 12/2011 |
| TW | 200924375 A | 6/2009 |

*Primary Examiner* — Khanh V Nguyen
*Assistant Examiner* — Khiem D Nguyen
(74) *Attorney, Agent, or Firm* — Studebaker & Brackett PC

(57) ABSTRACT

A power amplification circuit that includes: a capacitor element in which a first metal layer, a first insulating layer, a second metal layer, a second insulating layer and a third metal layer are sequentially stacked, the capacitor element including a first capacitor in which the first metal layer serves as one electrode thereof and the second metal layer serves as another electrode thereof, and a second capacitor in which the second metal layer serves as one electrode thereof and the third metal layer serves as another electrode thereof; and a transistor that amplifies a radio-frequency signal. The radio-frequency signal is supplied to the one electrode of the first capacitor. The other electrode of the first capacitor and the one electrode of the second capacitor are connected to a base of the transistor, and the other electrode of the second capacitor is connected to the emitter of the transistor.

1 Claim, 22 Drawing Sheets

(52) U.S. Cl.
CPC .. *H03F 2200/411* (2013.01); *H03F 2200/451* (2013.01); *H03F 2200/555* (2013.01)

(56) References Cited

U.S. PATENT DOCUMENTS

2005/0062540 A1   3/2005   Nakatani et al.
2005/0110068 A1   5/2005   Hino et al.

\* cited by examiner

POWER AMPLIFICATION CIRCUIT

CROSS REFERENCE TO RELATED APPLICATIONS

This application is Divisional of U.S. patent application Ser. No. 15/430,890 filed Feb. 13, 2017, and claims benefit of priority to Japanese Patent Application 2016-071197 filed Mar. 31, 2016, the entire content of which is incorporated herein by reference.

TECHNICAL FIELD

The present disclosure relates to a power amplification circuit.

BACKGROUND

A plurality of capacitors are sometimes serially connected with each other in a semiconductor integrated circuit such as a power amplification circuit. For example, Japanese Unexamined Patent Application Publication No. 2011-259215 discloses a CLC-type high pass filter that is formed of two serially connected capacitors and an inductor that has one end thereof connected to a connection point between the capacitors and the other end of which is grounded.

However, there is a problem in that, when a plurality of capacitors are mounted in a circuit, the circuit area is increased by the area occupied by one capacitor each time the number of capacitors is increased.

SUMMARY

The present disclosure was made in light of the above-described circumstances and it is an object thereof to provide a power amplification circuit that allows the number of capacitors to be increased while suppressing an increase in circuit area.

A power amplification circuit according to a preferred embodiment of the present disclosure includes: a capacitor element in which a first metal layer, a first insulating layer, a second metal layer, a second insulating layer and a third metal layer are sequentially stacked, the capacitor element including a first capacitor in which the first metal layer serves as one electrode thereof and the second metal layer serves as another electrode thereof, and a second capacitor in which the second metal layer serves as one electrode thereof and the third metal layer serves as another electrode thereof; and a transistor that amplifies a radio-frequency signal. The radio-frequency signal is supplied to the one electrode of the first capacitor, the other electrode of the first capacitor and the one electrode of the second capacitor are connected to a base of the transistor, and the other electrode of the second capacitor is connected to the emitter of the transistor.

According to the preferred embodiment of the present disclosure, a power amplification circuit that be provided that allows the number of capacitors to be increased while suppressing an increase in circuit area.

Other features, elements, characteristics and advantages of the present disclosure will become more apparent from the following detailed description of preferred embodiments of the present disclosure with reference to the attached drawings.

DETAILED DESCRIPTION

Figure 1:
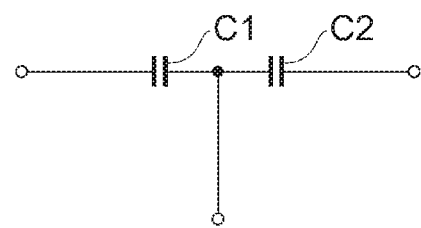
FIG. 1 illustrates the configuration of capacitors that are included in a power amplification circuit according to an embodiment of the present disclosure.

Hereafter, embodiments of the present disclosure will be described in detail while referring to the drawings. In addition, elements that are the same as each other will be denoted by the same symbols and repeated description thereof will be omitted.

FIG. 1 illustrates the configuration of capacitors that are included in a power amplification circuit according to an embodiment of the present disclosure. The power amplification circuit includes two serially connected capacitors C1 and C2, as illustrated in FIG. 1. A specific example of the configuration of the power amplification circuit will be described later.

Figure 2:
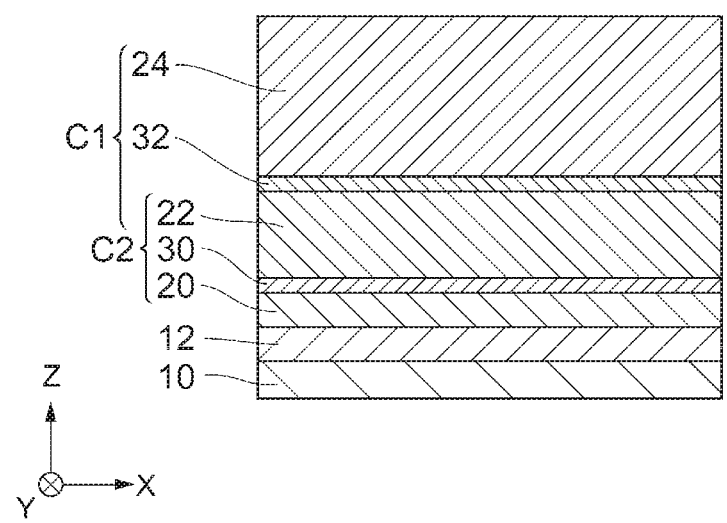
FIG. 2 illustrates an example of the sectional structure of the capacitors included in the power amplification circuit according to the embodiment of the present disclosure.

FIG. 2 illustrates an example of the sectional structure of the capacitors included in the power amplification circuit according to the embodiment of the present disclosure. In FIG. 2, a horizontal direction is an X axis direction, a widthwise direction is a Y axis direction and a thickness direction is a Z axis direction.

The capacitors C1 and C2 are formed on an isolation layer 12, which is formed on a substantially plate-shaped semiconductor substrate 10, for example. The capacitors C1 and C2 include metal layers 20, 22 and 24 and insulating layers 30 and 32.

The material of the semiconductor substrate 10 is not especially limited and may be a material having a crystalline structure, for example. Examples of a material having a crystalline structure include GaAs, Si, InP, SiC and GaN. In this embodiment, the semiconductor substrate 10 is formed of GaAs, for example.

The isolation layer 12 is formed on the semiconductor substrate 10. The material of the isolation layer 12 is not especially limited and in this embodiment, the isolation layer 12 is formed of a semiconductor (for example, GaAs) that is made to have an insulating property through ion implantation.

The metal layer 20 (third metal layer) is formed on the isolation layer 12. The metal layer 22 (second metal layer) is formed above the metal layer 20 with the insulating layer 30 (second insulating layer) interposed therebetween and the metal layer 24 (first metal layer) is formed so as to be stacked thereabove with the insulating layer 32 (first insulating layer) interposed therebetween.

The metal layers 20, 22 and 24 are formed of a conductive material. The material of the metal layers 20, 22 and 24 is not especially limited and the metal layers 20, 22 and 24 are formed using Au, Mo or Al, for example.

The insulating layers 30 and 32 are formed of insulating films, for example. The material of the insulating layers 30 and 32 is not especially limited and the insulating layers 30 and 32 are formed using SiN, $SiO_2$ or AlN, for example.

In this embodiment, for example, the metal layer 24, the insulating layer 32 and the metal layer 22 form the capacitor C1 (first capacitor) and the metal layer 22, the insulating layer 30 and the metal layer 20 form the capacitor C2 (second capacitor) (refer to FIG. 2). Specifically, the metal layer 24 functions as one electrode of the capacitor C1 and the metal layer 22 functions as the other electrode of the capacitor C1. A prescribed charge is accumulated in the insulating layer by applying a voltage between the metal layer 24 and the metal layer 22. Similarly, the metal layer 22 functions as one electrode of the capacitor C2 and the metal layer 20 functions as the other electrode of the capacitor C2. A prescribed charge accumulates in the insulating layer 30 as a result of a voltage being applied between the metal layer 22 and the metal layer 20.

In other words, in this embodiment, the capacitors C1 and C2 share the metal layer 22 as one of their electrodes. As a result of the metal layers 20, 22 and 24 forming a multilayer structure in the thickness direction (Z axis direction) in this way, the two capacitors C1 and C2 can be mounted in substantially the same area as would be occupied by one capacitor. Therefore, it is possible to increase the number of capacitors while suppressing an increase in the circuit area of the power amplification circuit. In the description given hereafter, a capacitor element in which a plurality of capacitors are formed using a multilayer structure will be referred to as a "multilayer capacitor element".

The shapes of the metal layers 20, 22 and 24 and the insulating layers 30 and 32 are not especially limited and may be substantially planar shapes (for example, substantially rectangular shapes) when seen in plan view in the thickness direction of the layers (from the positive side in Z axis direction). In addition, the positional relationship between the metal layers 20, 22 and 24 and the insulating layers 30 and is not especially limited, but the layers need to at least partially overlap in the Z axis direction.

Furthermore, although an example is illustrated in this embodiment in which two capacitors are formed using three metal layers, the number of metal layers and the number of capacitors formed are not limited to this example and three or more capacitors may be formed using four or more metal layers.

Next, a power amplification circuit in which such a multilayer capacitor element can be applied will be described.

First Application Example

Figure 3:
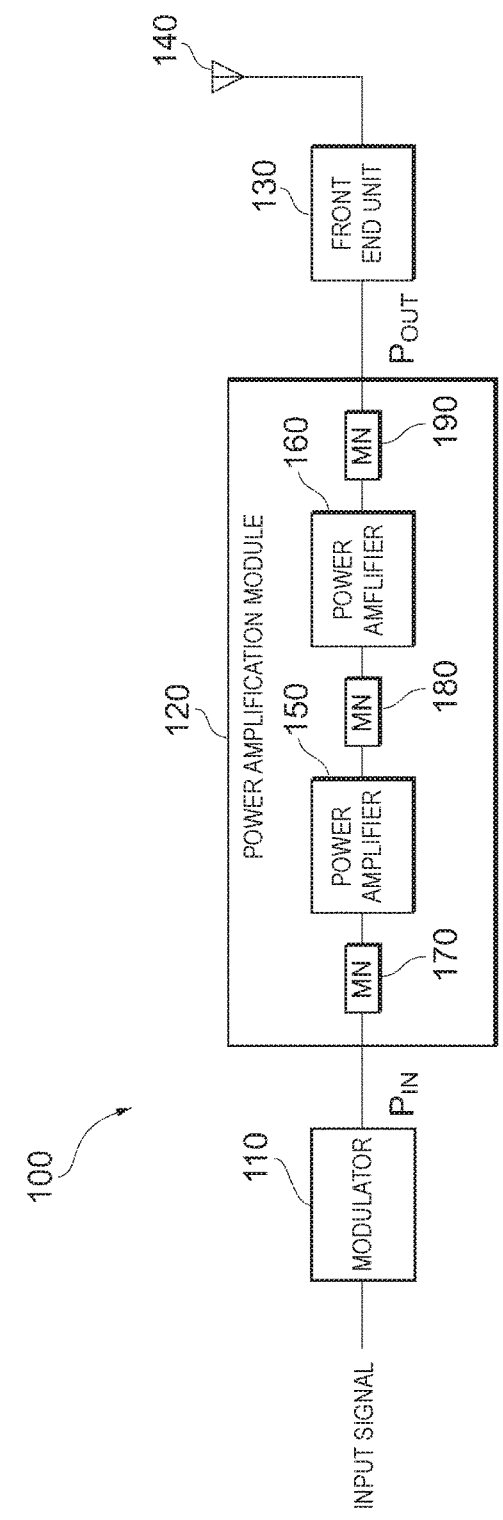
FIG. 3 illustrates an example configuration of a transmission unit that includes the power amplification circuit according to the embodiment of the present disclosure.

FIG. 3 illustrates an example configuration of a transmission unit that includes a power amplification circuit according to an embodiment of the present disclosure. The transmission unit 100 is, for example, used in a mobile communication device such as a cellular phone in order to transmit various signals such as speech and data to a base station. Although such a mobile communication device would also be equipped with a reception unit for receiving signals from the base station, the description of such a reception unit will be omitted here.

As illustrated in FIG. 3, the transmission unit 100 includes a modulator 110, a power amplification module 120, a front end unit 130 and an antenna 140.

The modulator 110 modulates an input signal on the basis of a modulation scheme of a standard such as GSM (registered trademark) and generates a radio frequency (RF) signal for performing wireless transmission. The RF signal has a frequency of around several hundred MHz to several GHz, for example.

The power amplification module 120 amplifies the power of the RF signal ($P_{IN}$) up to the level that is required to transmit the RF signal to the base station, and outputs an amplified signal ($P_{OUT}$). The power amplification module 120 may be formed of two power amplifiers, for example. Specifically, as illustrated in FIG. 3, the power amplification module 120 may include power amplifiers 150 and 160 and matching networks (MNs) 170, 180 and 190. The power amplifier 150 is a first stage (driver stage) amplifier and outputs a signal (first amplified signal) obtained by amplifying an input RF signal. The power amplifier 160 is a subsequent stage (power stage) amplifier and outputs a signal (second amplified signal) obtained by amplifying an input RF signal. The matching networks 170, 180 and 190 are circuits for matching the impedances between the circuits and are formed using capacitors and inductors. The number of power amplifiers that constitute the power amplification module 120 is not limited to two and may instead be one or three or more.

The front end unit 130 filters an amplified signal and switches a reception signal received from the base station. The amplified signal output from the front end unit 130 is transmitted to the base station via the antenna 140.

Figure 4:
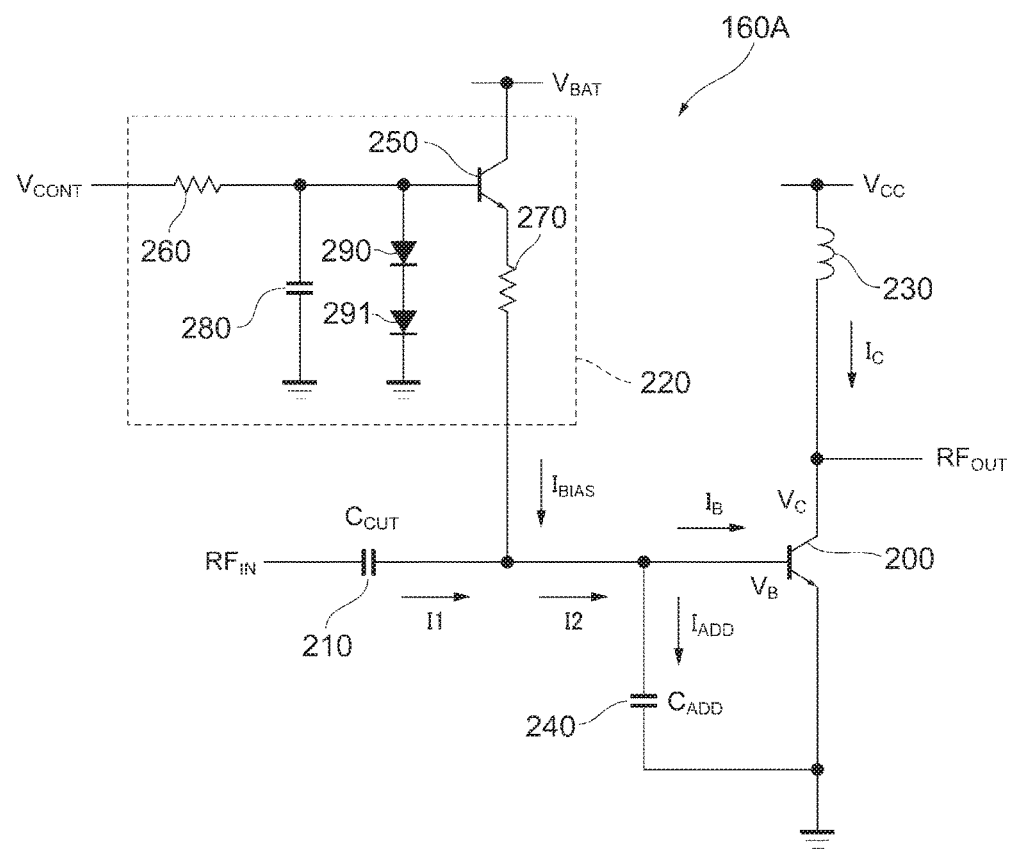
FIG. 4 illustrates an example configuration of a power amplifier included in the power amplification circuit according to the embodiment of the present disclosure.

FIG. 4 illustrates an example configuration of the power amplifier 160 (power amplifier 160A) included in the power amplification circuit according to the embodiment of the present disclosure. The power amplifier 160A includes an NPN transistor (hereafter, simply "transistor") 200, a capacitor 210, a bias circuit 220, an inductor 230 and a capacitor 240.

The transistor 200 is a heterojunction bipolar transistor (HBT), for example. A power supply voltage $V_{CC}$ is supplied to the collector of the transistor 200 via the inductor 230, an RF signal $RF_{IN}$ is input to the base of the transistor 200 via the capacitor 210 and the transistor 200 has a common emitter. In addition, a bias current or a bias voltage is supplied to the base of the transistor 200 from the bias circuit 220. The transistor 200 amplifies the RF signal input to the base thereof and outputs an amplified signal $RF_{out}$ from the collector thereof.

The RF signal $RF_{IN}$ is input to one end (first metal layer) of the capacitor 210 (first capacitor, hereafter also referred to as "DC cut capacitor") and the other end (second metal layer) of the capacitor 210 is connected to the base of the transistor 200. The capacitor 210 cuts a DC component of the RF signal and outputs the resulting RF signal to the base of the transistor 200.

The bias circuit 220 includes a transistor 250, resistance elements 260 and 270, a capacitor 280 and diodes 290 and 291. A battery voltage $V_{BAT}$ is supplied to the collector of the transistor 250, a bias control voltage $V_{CONT}$ is supplied to the base of the transistor 250 via the resistance element 260 and the emitter of the transistor 250 is connected to one end of the resistance element 270. The bias control voltage $V_{CONT}$ is applied to the one end of the resistance element 260 and the other end of the resistance element 260 is connected to the base of the transistor 250. The one end of the resistance element 270 is connected to the emitter of the transistor 250 and the other end of the resistance element 270 is connected to the base of the transistor 200. One end of the capacitor 280 is connected to the base of the transistor 250 and the other end of the capacitor 280 is grounded. The diodes 290 and 291 are connected in series with each other, the anode of the diode 290 is connected to the base of the transistor 250 and the cathode of the diode 291 is grounded. The bias circuit 220 outputs a bias current $I_{BIAS}$ to the base of the transistor 200 on the basis of the bias control voltage $V_{CONT}$. The capacitor 280 is able to reduce noise input to the base of the transistor 250. In addition, the diodes 290 and 291 are able to suppress fluctuations in the base voltage of the transistor 250 that occur with variations in the bias control voltage $V_{CONT}$.

The power supply voltage $V_{CC}$ is applied to one end of the inductor 230 and the other end of the inductor 230 is connected to the collector of the transistor 200. The power supply voltage $V_{CC}$ is a voltage of a prescribed level that is generated by a regulator, for example.

One end (second metal layer) of the capacitor 240 (second capacitor, hereafter, also referred to as "base-emitter capacitor") is connected to the base of the transistor 200 and the other end (third metal layer) of the capacitor 240 is connected to the emitter of the transistor 200. A capacitance value $C_{ADD}$ of the capacitor 240 is substantially the same as the capacitance value of the transistor 200 when the transistor 200 is off. The capacitor 240 is provided in order to improve the power adding efficiency of the power amplifier 160A at the time of a large output.

First, operation of the power amplifier 160A in a case where the capacitor 240 is not provided will be described. At the time of output of a large signal, the amplitude of the RF signal input to the capacitor 210 becomes large and a base voltage $V_B$ of the transistor 200 at the time of a negative cycle of the RF signal falls by a large amount and the transistor 200 turns off. Then, when the base voltage $V_B$ of the transistor 200 falls by a large amount, the bias current $I_{BIAS}$ from the bias circuit 220 increases. When the bias current $I_{BIAS}$ increases, the timing at which the transistor 200 turns on becomes earlier. As a result, the period of time in which a collector current $I_C$ and a collector voltage $V_C$ of the transistor 200 overlap becomes longer. Therefore, from the fact that power is determined by multiplying current and voltage together, power is also generated in an interval in which the RF signal is not amplified and consequently the power adding efficiency falls.

In contrast, the power adding efficiency can be improved in the power amplifier 160A due to the provision of the capacitor 240. Specifically, in the power amplifier 160A, when the transistor 200 turns off and the base voltage $V_B$ is about to fall, a current flows to the base of the transistor 200 from the capacitor 240. The fall in the base voltage $V_B$ of the transistor 200 is suppressed by this current. Therefore, an increase in the bias current $I_{BIAS}$ from the bias circuit 220 is suppressed. As a result, the period of time in which the collector current $I_C$ and the collector voltage $V_C$ of the transistor overlap (period in which power is generated) becomes shorter and therefore the power adding efficiency can be improved.

The power amplifier 160A is illustrated in FIG. 4 as an example of the power amplifier 160, but the power amplifier 160 can also have a configuration in which a plurality of unit cells are connected in parallel with each other.

Figure 5:
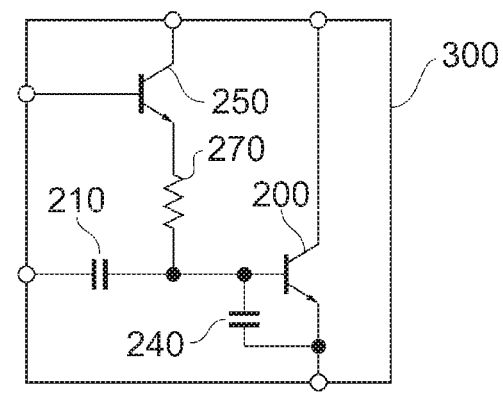
FIG. 5 illustrates an example configuration of a unit cell that can be used in the power amplifier.

FIG. 5 illustrates an example configuration of a unit cell that can be used in the power amplifier 160. A unit cell 300 includes the transistor 200, the capacitors 210 and 240, the transistor 250 and the resistance element 270 of the power amplifier 160A illustrated in FIG. 4.

Figure 6:
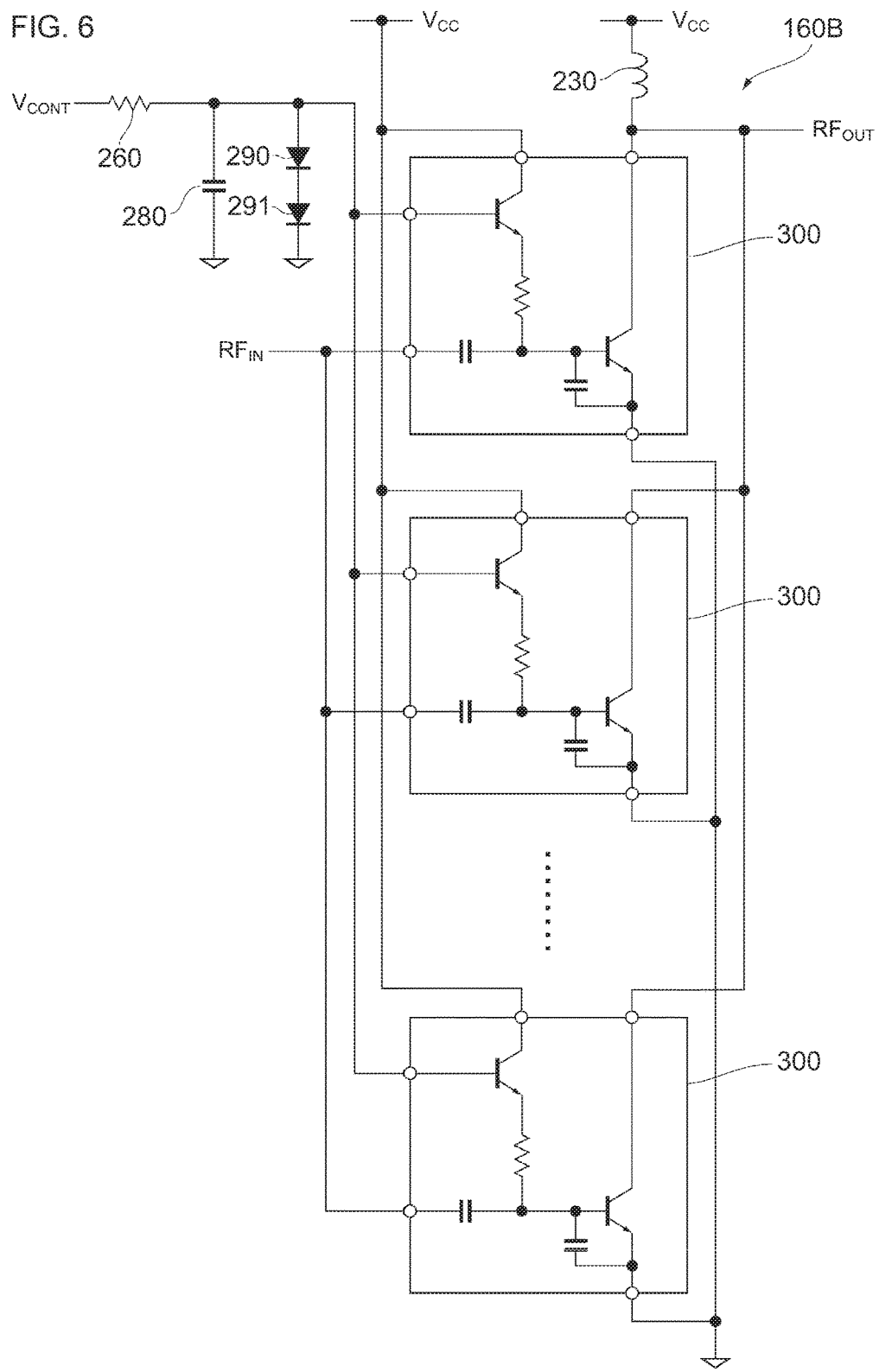
FIG. 6 illustrates the configuration of a power amplifier in which a plurality of unit cells are connected in parallel with each other.

FIG. 6 illustrates the configuration of a power amplifier 160B in which a plurality (for example, sixteen) of the unit cells 300 are connected in parallel with each other. By providing the capacitor 240 in each of the unit cells 300 of the power amplifier 160B in which a plurality of unit cells 300 are connected in parallel with each other, the power adding efficiency can be improved as described above. The configuration of the unit cell 300 illustrated in FIG. 5 is merely an example and elements included in the unit cell are not limited to those in this configuration.

Figure 7:
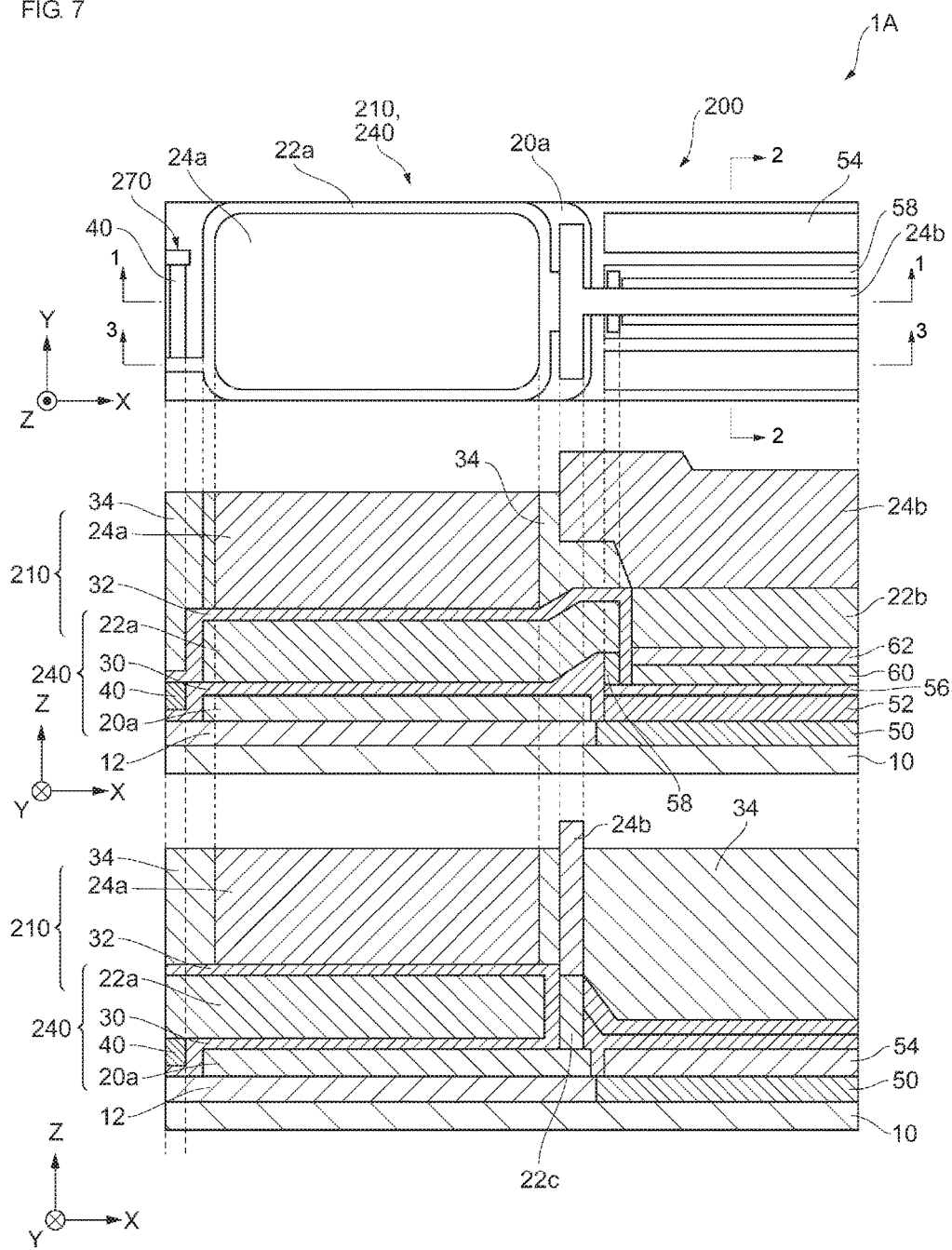
FIG. 7 illustrates a plan view, a sectional view taken along line 1-1 and a sectional view taken along line 3-3 of an example configuration of two capacitors, a resistance element and a transistor in a case where one of the capacitors is formed using a multilayer capacitor element.
Figure 8:
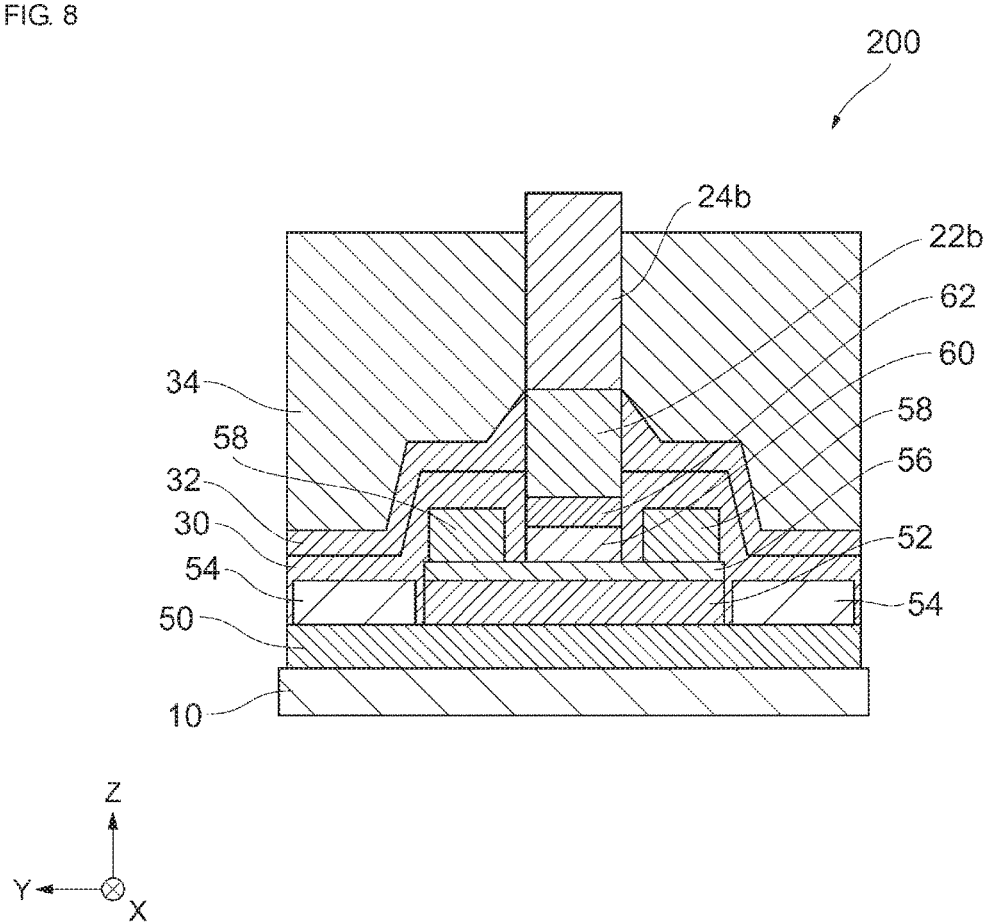
FIG. 8 is a sectional view taken along line 2-2 of FIG. 7.
Figure 9:
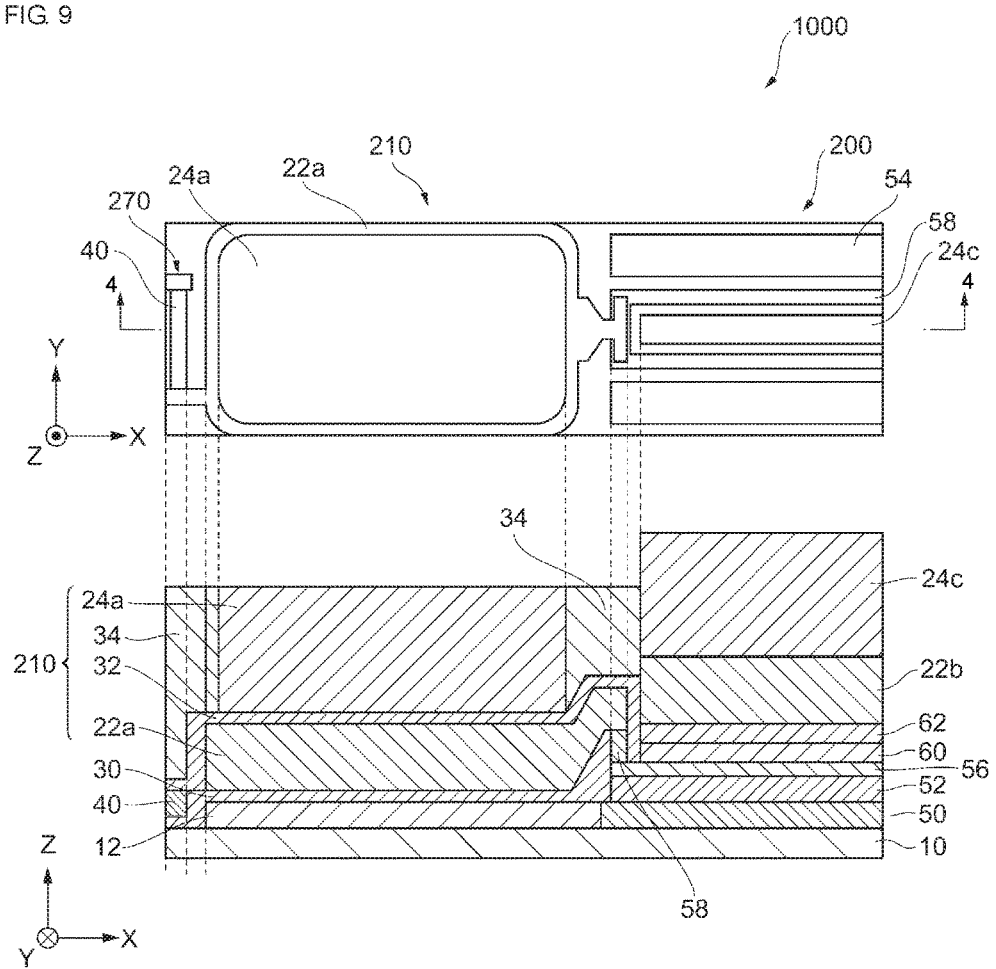
FIG. 9 illustrates a plan view and a sectional view taken along line 4-4 of an example configuration (comparative example 1) of a capacitor, a resistance element and a transistor.
Figure 10:
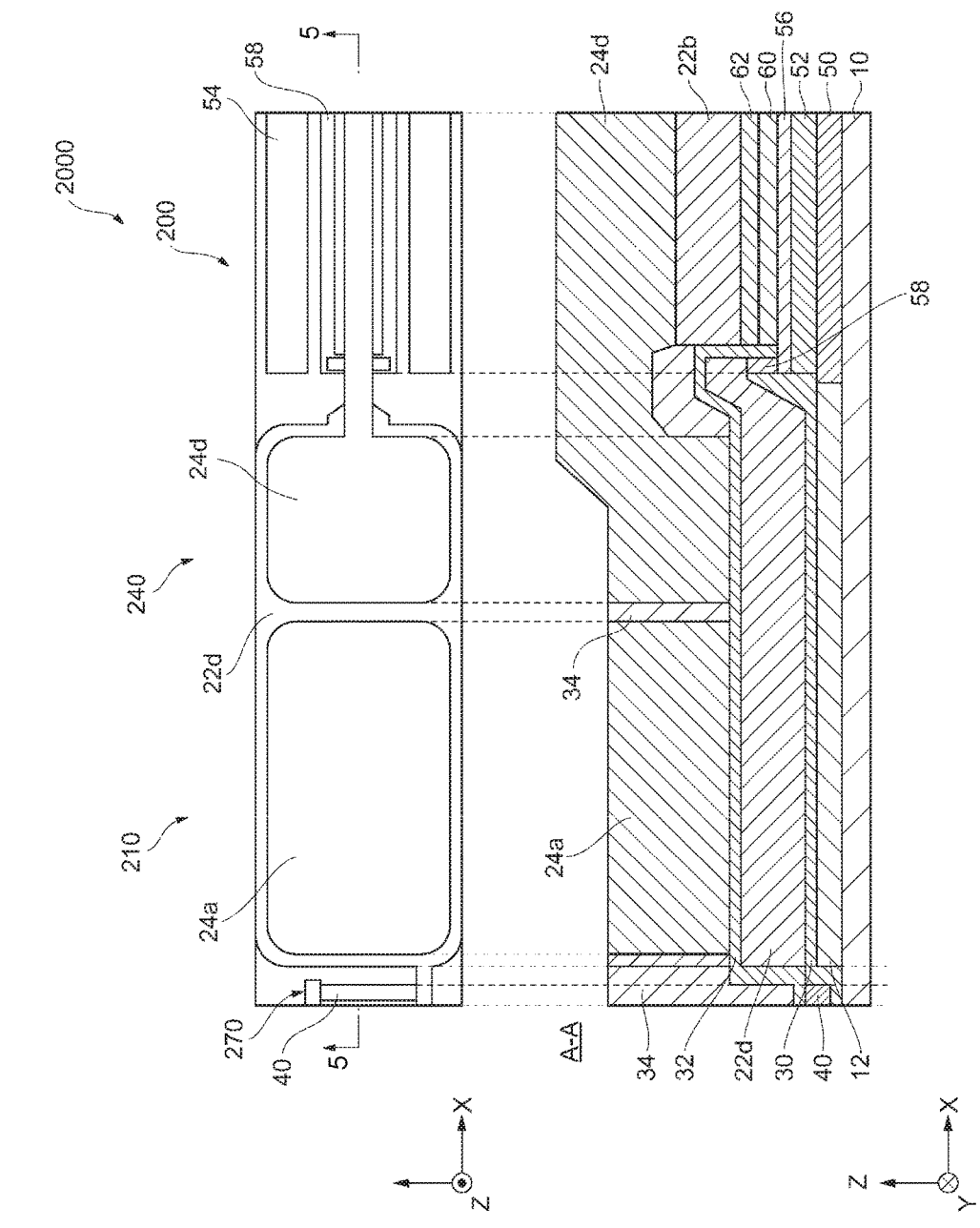
FIG. 10 illustrates a plan view and a sectional view taken along line 5-5 of an example configuration (comparative example 2) of capacitors, a resistance element and a transistor in a case where one of the capacitors is formed as an MIM capacitor.

Next, the structures of the capacitors 210 and 240, the resistance element 270 and the transistor 200 in the case where a multilayer capacitor element is applied to the power amplifier 160A will be described while referring to FIGS. 7 to 10. FIG. 7 illustrates a plan view, a sectional view taken along line 1-1 and a sectional view taken along line 3-3 of an example configuration of the capacitors 210 and 240, the resistance element 270 and the transistor 200 in a case where the capacitor 240 is formed using a multilayer capacitor element. FIG. 8 is a sectional view taken along line 2-2 of FIG. 7. FIG. 9 illustrates a plan view and a sectional view taken along line 4-4 of an example configuration (comparative example 1) of the capacitor 210, the resistance element 270 and the transistor 200. FIG. 10 illustrates a plan view and a sectional view taken along line 5-5 of an example configuration (comparative example 2) of the capacitors 210 and 240, the resistance element 270 and the transistor 200 in a case where the capacitor 240 is formed as an MIM capacitor. In the following description, similar symbols are used to denote metal layers that are formed in the same steps (for example, metal layer 20a, 20b, . . . etc.). In addition, illustration of the insulating layers 30, 32 and 34 is omitted from the plan view illustrated in FIG. 7. This is also the case for the plan views of FIGS. 9 to 13 referred to below.

The structure of a power amplification circuit 1A in the case where the capacitor 240 is formed using a multilayer capacitor element will be described while referring to FIGS. 7 and 8. The power amplification circuit 1A includes the capacitor 210 (DC cut capacitor), the capacitor 240 (base-emitter capacitor), the resistance element 270 and the transistor 200.

As illustrated in FIG. 7, in the power amplification circuit 1A, the capacitors 210 and 240 and the resistance element 270 are provided on the negative side of the semiconductor substrate 10 in the X axis direction (hereafter, "capacitor side") and the transistor 200 is provided on the positive side of the semiconductor substrate 10 in the X axis direction (hereafter, "transistor side"). In this embodiment, the capacitors 210 and 240 are formed so as to be adjacent to one side (for example, negative side in X axis direction) of the transistor 200.

First, the structure on the capacitor side will be described. On the capacitor side, a metal layer 20a (third metal layer), the insulating layer 30 (second insulating layer), a metal layer 22a (second metal layer), the insulating layer 32 (first insulating layer) and a metal layer 24a (first metal layer) are stacked sequentially upward on the isolation layer 12 (refer to FIG. 7)

The capacitor 210 (first capacitor) illustrated in FIG. 4 is formed of the metal layer 24a, the insulating layer 32 and the metal layer 22a. Specifically, the metal layer 24a (first metal layer) is supplied with the RF signal $RF_{IN}$ and forms one electrode of the capacitor 210. The metal layer 22a (second metal layer) is led out to the positive side in the X axis direction (transistor side), is electrically connected to a base electrode 58 of the transistor 200, which will be described later, and forms the other electrode of the capacitor 210. Thus, a prescribed charge accumulates in the insulating layer 32 (first insulating layer) between the metal layer 24a and the metal layer 22a and the capacitor 210 (DC cut capacitor) having a prescribed capacitance value (for example, $C_{CUT}$=0.7 pF) is formed.

The capacitor 240 (second capacitor) illustrated in FIG. 4 is formed of the metal layer 22a, the insulating layer 30 and the metal layer 20a. Specifically, the metal layer 22a (second metal layer) is electrically connected to the base electrode 58 and forms one electrode of the capacitor 240, as described above. The metal layer 20a (third metal layer) is electrically connected to an emitter electrode 62 of the transistor 200, which will be described later, and forms the other electrode of the capacitor 240. Thus, a prescribed charge accumulates in the insulating layer 30 (second insulating layer) between the metal layer 22a and the metal layer 20a and the capacitor 240 (base-emitter capacitor) having a prescribed capacitance value (for example, $C_{ADD}$=0.35 pF) is formed. The details of the connection between the metal layer 20a and the emitter electrode 62 will be described later.

The resistance element 270 illustrated in FIG. 4 is formed of a resistor 40 formed adjacent to one side (for example, negative side in X axis direction) of the capacitors 210 and 240. One end of the resistor 40 is formed by the metal layer 22a and is electrically connected to the base electrode 58 of the transistor 200, which will be described later. A bias current from a bias circuit (not illustrated) is supplied to the other end of the resistor 40. Thus, the resistor 40 functions as a base ballast resistor of the transistor 200.

Next, the structure on the transistor side will be described. A heterojunction bipolar transistor in which at least either the collector layer and the base layer or the base layer and the emitter layer form a heterojunction will be described as the transistor 200 of the power amplification circuit 1A.

The transistor 200 illustrated in FIG. 4 is formed on the semiconductor substrate 10, for example. The transistor 200 includes a sub-collector layer 50, a collector layer 52, collector electrodes 54, a base layer 56, the base electrode 58, an emitter layer 60 and the emitter electrode 62 (refer to FIG. 8).

The sub-collector layer 50 is formed on the surface of part of the semiconductor substrate 10. The material of the sub-collector layer 50 is not especially limited and may be a material having a crystalline structure, for example. The sub-collector layer 50 functions as the collector along with the collector layer 52.

The collector layer 52 is formed on a central part of the sub-collector layer 50 in the width direction (Y axis direction) of the sub-collector layer 50 (refer to FIG. 8). The material of the collector layer 52 is not especially limited and may be a material having a crystalline structure, for example. In this embodiment, the collector layer 52 is formed of the same material as the sub-collector layer 50 and contains GaAs as a main component, for example. The crystal orientation of the GaAs of the collector layer 52 is the same as the crystal orientation of the GaAs of the semiconductor substrate 10, for example.

The entire collector layer 52 containing GaAs may be formed of an n-type semiconductor or a p-type semiconductor. In the case where the collector layer 52 is an n-type semiconductor, the transistor 200 is formed of an npn junction. In addition, in the case where the collector layer 52 is a p-type semiconductor, the transistor 200 is a formed of a pnp junction. However, it is preferable that the GaAs of the collector layer 52 be an n-type semiconductor from the viewpoint that the frequency characteristics are superior in the case of an npn junction than in the case of a pnp junction due to the hole mobility being much lower than the electron mobility (electron mobility is around 0.85 m$^2$/(Vs), hole mobility is around 0.04 m$^2$/(Vs)) . Hereafter, in this embodiment, it will be assumed that the collector layer 52 is an n-type semiconductor. The collector layer 52 is doped with Si, S, Se, Te, Sn or the like in order to make the collector layer 52 into an n-type semiconductor. In addition, the collector layer 52 would be doped with C, Mg, Be, Zn, Cd or the like as a dopant in order to make the collector layer 52 into a p-type semiconductor.

The (pair of) collector electrodes 54 are formed on the sub-collector layer 50 at both ends of the sub-collector layer in the width direction (Y axis direction) such that the collector layer 52 is interposed therebetween (refer to FIG. 8). Alternatively, a collector electrode 54 may instead be formed on the sub-collector layer 50 on just one side of the collector layer 52 (positive or negative side in Y axis direction). The material of the collector electrodes 54 is not especially limited and may be Ti/Pt, WSi, Pt/Ti/Au or AuGe/Ni/Au, for example. Here, "/" is used to represent a multilayer structure. For example, "Ti/Pt" represents a structure in which Pt is stacked on Ti. The same is true in descriptions hereafter.

The base layer 56 is formed on the collector layer 52 (refer to FIGS. 7 and 8). The material of the base layer 56 is not especially limited and may be a material having a crystalline structure, for example. In this embodiment, the base layer 56 contains GaAs as a main component and is formed of the same material as the sub-collector layer 50 and the collector layer 52, for example.

Furthermore, the GaAs that is the main component of the base layer 56 may be an n-type semiconductor or a p-type semiconductor. In this embodiment, since the collector layer 52 is an n-type semiconductor, a p-type semiconductor is employed as the GaAs of the base layer 56.

The base electrode 58 is formed on the base layer 56 (refer to FIGS. 7 and 8). The material of the base electrode 58 is not especially limited and may be Ti/Pt, WSi, Pt/Ti/Au or AuGe/Ni/Au, for example. The base electrode 58 is provided so as to be interposed between the base layer 56 and the metal layer 22a in a boundary region between the capacitor side and the transistor side (refer to FIG. 7). Thus, the base layer 56 is electrically connected to the metal layer 22a (other electrode of capacitor 210 and one electrode of capacitor 240) via the base electrode 58.

The emitter layer 60 is formed on the base layer 56 (refer to FIGS. 7 and 8). So long as the material of the emitter layer 60 is a semiconductor, the material of the emitter layer 60 is not especially limited. However, in this embodiment, since the emitter layer 60 forms a heterojunction with the base layer 56, it is preferable that the emitter layer 60 be formed of a semiconductor having, as a main component, a material that is lattice matched with the main component of the base layer 56.

The emitter electrode 62 is formed on the emitter layer (refer to FIGS. 7 and 8). The material of the emitter electrode 62 is not especially limited and may be Ti/Pt, WSi or AuGe/Ni/Au, for example.

Metal layers 22b and 24b are formed on the transistor 200. Specifically, the metal layers 22b and 24b are sequentially stacked upward on the emitter electrode 62 (refer to FIGS. 7 and 8).

Furthermore, the transistor 200 and the peripheries of the metal layers 22b and 24b are surrounded by the insulating layers 30, 32 and 34 (refer to FIG. 8). The materials of the insulating layers 30, 32 and 34 are not especially limited and the insulating layers 30 and 32 may be formed of SiN films and the insulating layer 34 may be formed of a polyimide film, for example. In addition, the insulating layers 30, 32 and 34 may have multilayer structures formed of inorganic films and organic films.

Next, the connection between the metal layer 20a on the capacitor side and the emitter layer 60 on the transistor side will be described. The metal layer 20a is formed between the isolation layer 12 and the insulating layer 30. The metal layer 20a is formed so as to be longer in the X axis direction than the metal layer 22a formed thereabove in the cross section taken along line 3-3 of FIG. 7 (refer to sectional view in FIG. 7 taken along line 3-3). The emitter layer 60 is electrically connected to the metal layer 20a via the metal layers 22b, 24b and 22c (through electrode). Specifically, the metal layer 24b, which is stacked on the metal layer 22b on the transistor side, extends to the capacitor side and is electrically connected to the metal layer 20a via a through electrode above the metal layer 20a on the capacitor side. For example, in this embodiment, the metal layer 24b is formed so as to extend up to a position above the metal layer 20a on the capacitor side when seen in plan view from the positive side in the Z axis direction (refer to plan view of FIG. 7). The metal layer 24b is formed above the metal layer 22a so as to extend up to positions in the vicinity of both sides of the metal layer 22a in the Y axis direction (refer to plan view of FIG. 7).

Thus, in the cross section taken along line 1-1 in FIG. 7, the metal layer 20a and the metal layer 24b are separated by the insulating layer 32, the metal layer 22a and the insulating layer 30 and are not electrically connected to each other (refer to sectional view taken along line 1-1 in FIG. 7). On the other hand, in the cross section taken along line 3-3 in FIG. 7, the metal layer 22c is formed in a region in which the metal layer 20a extends further toward the positive side in the X axis direction than the metal layer 22a and the metal layer 20a is electrically connected to the metal layer 24b via the metal layer 22c (refer to sectional view taken along line 3-3 in FIG. 7). Therefore, the metal layer 20a is electrically connected to the emitter electrode 62 and the emitter layer 60 of the transistor 200 via the metal layer 22c, 24b and 22b (refer to FIG. 7). The connection between the metal layer 20a and the emitter layer 60 and the connection between the metal layer 22a and the base layer 56 are not limited to these forms. For example, the metal layer 20a and the metal layer 24b may be connected to each other in the vicinity of the line 1-1 in FIG. and the metal layer 22a and the base electrode 58 may be connected to each other in the vicinity of the line 3-3 in FIG. 7.

With the above-described configuration, the capacitor 240 can be formed by using one electrode of the capacitor 210 in the power amplification circuit 1A. In other words, the capacitors 210 and 240 share the metal layer 22a as one of their electrodes. By forming a multilayer structure in the thickness direction (Z axis direction) with the metal layers 20a, 22a and 24a in this way, two capacitors 210 and 240 can be mounted in substantially the same area as would be occupied by one capacitor. Thus, the power amplification circuit 1A can improve the power adding efficiency of the power amplifier 160A as described above while suppressing an increase in circuit area.

Next, the structure of a power amplification circuit 1000 (comparative example 1) in the case where the power amplifier 160A is not provided with the capacitor 240 will be described while referring to FIG. 9. The power amplification circuit 1000 includes the capacitor 210 (DC cut capacitor), the resistance element 270 and the transistor 200.

As illustrated in FIG. 9, in the power amplification circuit 1000, the capacitor 210 and the resistance element 270 are provided on a capacitor side of the semiconductor substrate and the transistor 200 is provided on a transistor side of the semiconductor substrate 10.

In contrast to the power amplification circuit 1A illustrated in FIG. 7, the power amplification circuit 1000 is not provided with the metal layer 20a on the capacitor side. In other words, the metal layer 24a, the insulating layer 32 and the metal layer 22a form the capacitor 210 (DC cut capacitor) and function to remove the direct current component of the RF signal $RF_{IN}$.

Compared with the power amplification circuit 1000 (comparative example 1), it is clear that the capacitor 240 is newly formed in the power amplification circuit 1A illustrated in FIG. 7 without the circuit area substantially changing from that of the power amplification circuit 1000.

Next, the structure of a power amplification circuit 2000 (comparative example 2) in the case where the capacitor 240 is formed of a metal-insulator-metal (MIM) capacitor will be described while referring to FIG. 10. The power amplification circuit 2000 includes the capacitor 210 (DC cut capacitor), the capacitor 240 (base-emitter capacitor), the resistance element 270 and the transistor 200.

In the power amplification circuit 2000 illustrated in FIG. 10, the two capacitors 210 and 240 are formed parallel to each other in a lateral direction (X axis direction) on the capacitor side. Specifically, two metal layers 24a and 24d, which are separated from each other by the insulating layer 34, are formed on the insulating layer 32, which is formed on the metal layer 22d (refer to FIG. 10). The capacitors are formed as a result of these two metal layers 24a and 24d forming pairs with the metal layer 22d. In other words, the capacitor 210 is formed as a result of the metal layer 24a on the negative side in the X axis direction forming a pair with the metal layer 22d (which is electrically connected to base electrode 58). On the other hand, the metal layer 24d on the positive side in the X axis direction is led out to the transistor side and is electrically connected to the emitter layer 60 via the metal layer 22b and the emitter electrode 62. Therefore, the capacitor 240 (base-emitter capacitor) is formed as a result of the metal layer 24d forming a pair with the metal layer 22d (which is electrically connected to base electrode 58).

As described above, as a result of the power amplification circuit 2000 being provided with the capacitor 240, the power adding efficiency of the power amplifier 160A can be improved compared with the power amplification circuit 1000. However, since the capacitors 210 and 240 are provided parallel to each other in the lateral direction, the length of the capacitor side of the power amplification circuit 2000 in the lateral direction (X axis direction) is longer than in the power amplification circuit 1000. Therefore, the circuit area is increased in the power amplification circuit 2000 compared to the power amplification circuit 1000.

In contrast, by adopting the above-described configuration in the power amplification circuit 1A illustrated in FIG. 7, the capacitor 240 (metal layer 22a, insulating layer and metal layer 20a) can be formed by being stacked below (negative side in Z axis direction) the capacitor 210 (metal layer 24a, insulating layer 32 and metal layer 22a). Therefore, the capacitor 240 can be newly formed without there being a substantial change from the arrangement of the power amplification circuit 1000 that is not provided with the capacitor 240 (for example, by changing the area occupied by the capacitor 210 by around several %). In addition, compared to the power amplification circuit 2000, the size of the increase in the circuit area caused by providing the capacitor 240 is suppressed. Therefore, with the power amplification circuit 1A, the power adding efficiency can be improved while suppressing an increase in circuit area caused by increasing the number of capacitors. In addition, although the capacitor formed on the upper side (positive side in Z axis direction) of the multilayer capacitor element is the capacitor 210 and the capacitor formed on the lower side (negative side in Z axis direction) of the multilayer capacitor element is the capacitor 240 in the power amplification circuit 1A, the arrangement of these capacitors may be reversed.

Figure 11:
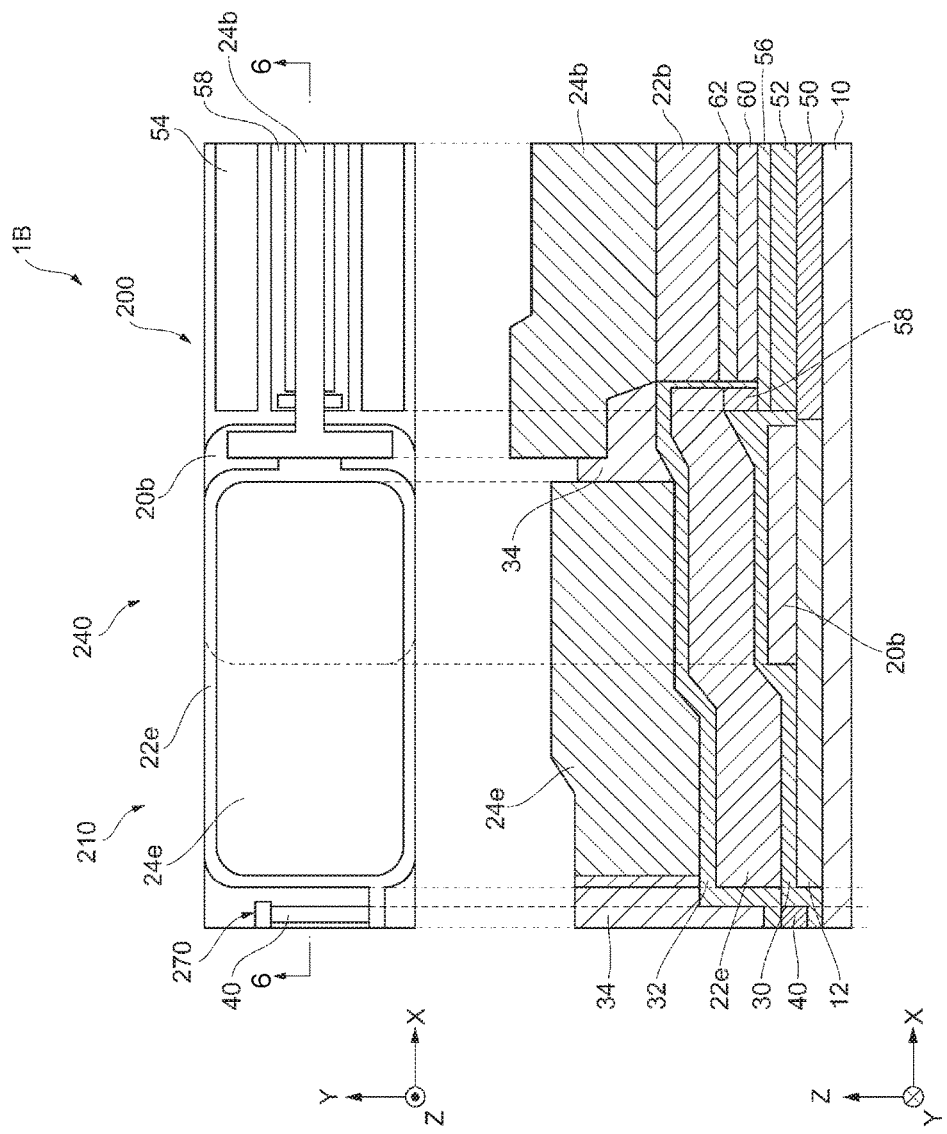
FIG. 11 illustrates a plan view and a sectional view taken along line 6-6 of capacitors, a resistance element and a transistor in a modification of the case where one of the capacitors is formed using a multilayer capacitor element.

FIG. 11 illustrates a plan view and a sectional view taken along line 6-6 of the capacitors 210 and 240, the resistance element 270 and the transistor 200 in a modification (power amplification circuit 1B) of the case where the capacitor 240 is formed using a multilayer capacitor element.

Compared with the power amplification circuit 1A illustrated in FIG. 7, the power amplification circuit 1B illustrated in FIG. 11 includes metal layers 20b, 22e and 24e instead of the metal layers 20a, 22a and 24a.

The metal layer 20b is shorter in the lateral direction (X axis direction) than the metal layer 20a. Specifically, the metal layer 20b is disposed on the surface of only part of the isolation layer 12 on the capacitor side (for example, part on positive side in X axis direction) in the power amplification circuit 1B. That is, part of the structure on the capacitor side forms a multilayer capacitor element. Thus, the capacitor 210 (metal layer 24e, insulating layer 32 and metal layer 22e) is formed of an MIM capacitor and a multilayer capacitor element arranged in parallel and the capacitor 240 (metal layer 22e, insulating layer 30 and metal layer 20b) is formed of the multilayer capacitor element on part of the capacitor side.

Therefore, the metal layer 20b does not need to be formed beneath the entirety of the metal layer 22e and may be formed beneath only part of the metal layer 22e. The configuration of the electrical connection between the metal layer 24b and the metal layer 20b is the same as in the power amplification circuit 1A illustrated in FIG. 7 and therefore detailed description thereof is omitted.

Figure 12:
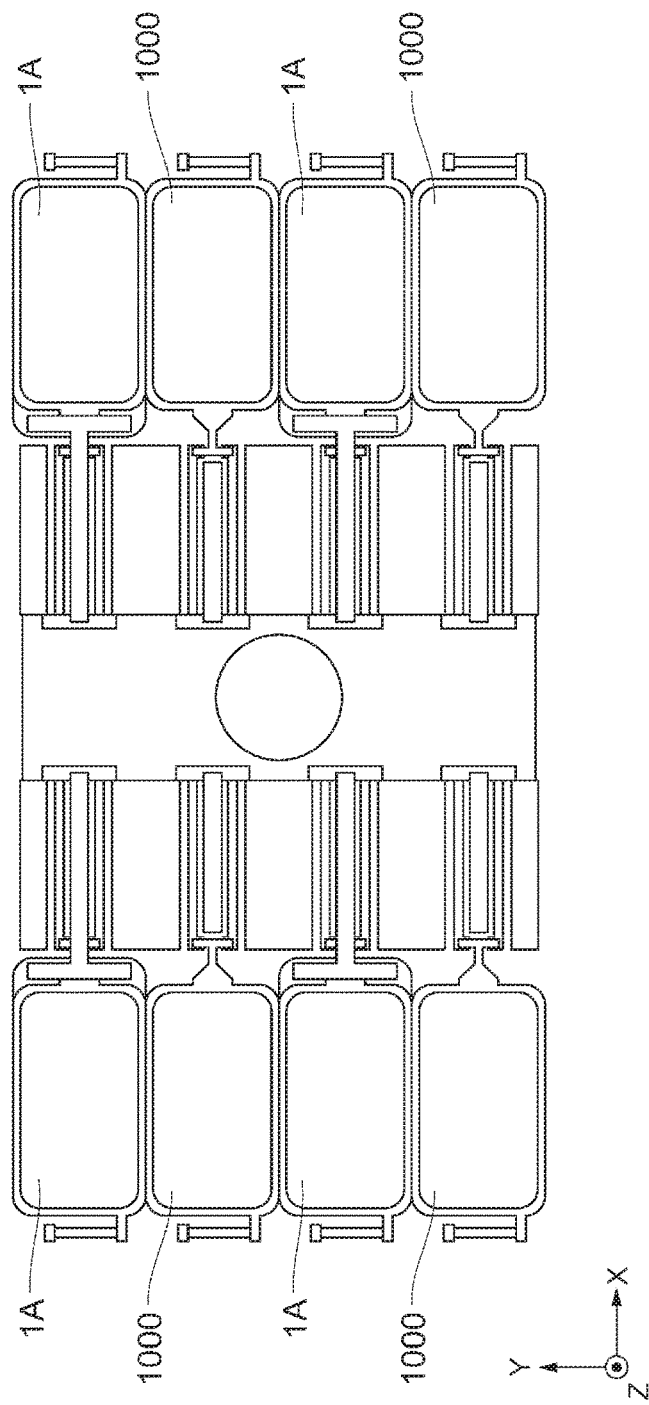
FIG. 12 illustrates an arrangement example of a case where a plurality of two types of power amplification circuits are connected in parallel with each other.

FIG. 12 illustrates an arrangement example in which a plurality of (for example, eight) power amplification circuits are connected in parallel with each other. The embodiment illustrated in FIG. 12 is an example in which four power amplification circuits 1A and four power amplification circuits 1000 are alternately connected in parallel with each other.

As illustrated in FIG. 12, it is clear that the power amplification circuits 1A can be mounted with substantially no change in the area occupied from the area occupied by the power amplification circuits 1000. In the case where the power amplification circuits are to be mounted such that a plurality of the capacitors 210 and 240, the resistance element 270 and the transistor 200 are connected in parallel with each other, the power amplification circuit 1A may be applied for only some of the transistors and so forth as illustrated in FIG. 12, or the power amplification circuit 1A may be applied for all of the transistors and so forth.

Next, other example configurations of the capacitor 240 (base-emitter capacitor) will be described while referring to FIGS. 13 to 15.

Figure 13:
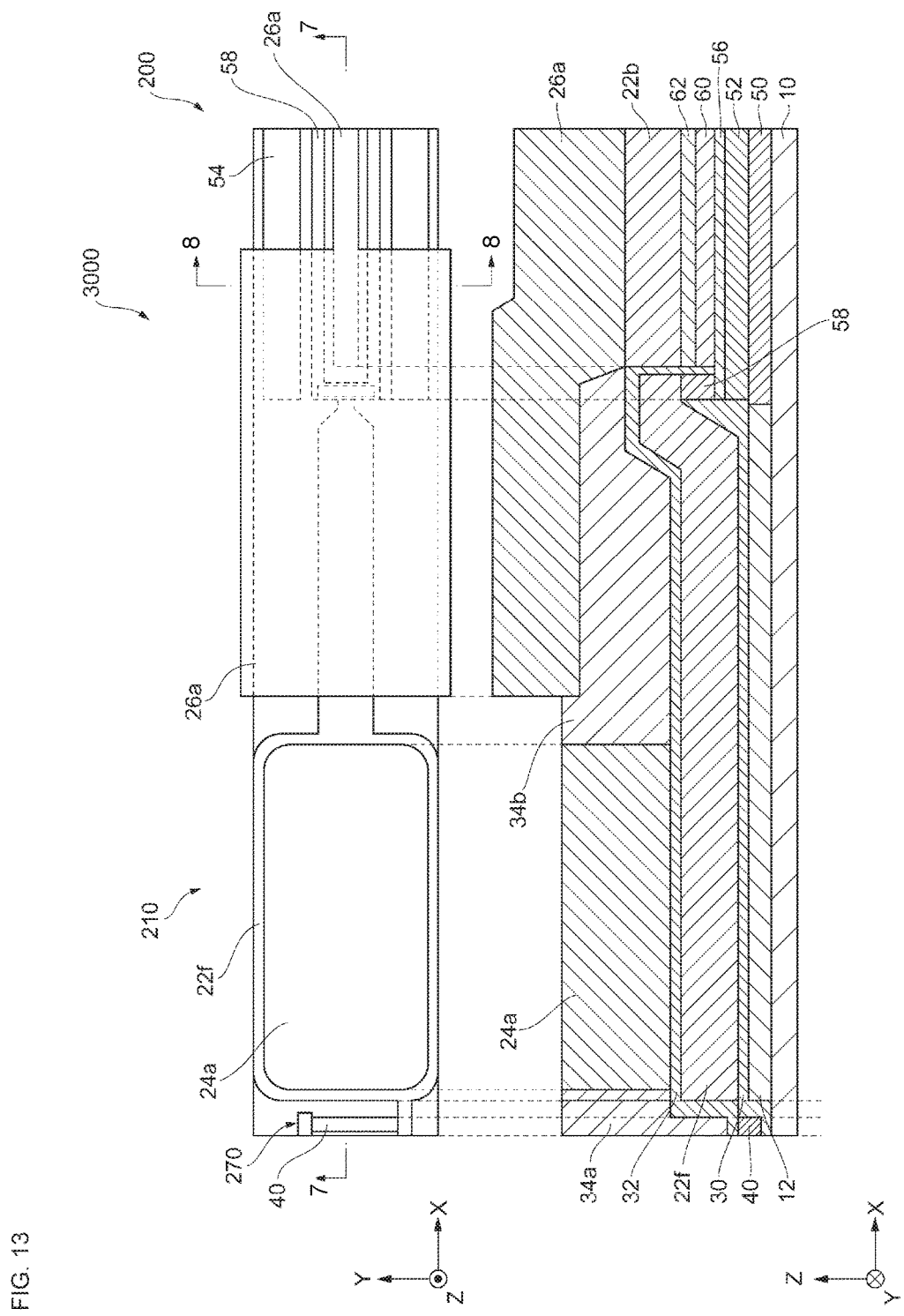
FIG. 13 illustrates a plan view and a sectional view taken along line 7-7 of an example configuration (comparative example 3) of a capacitor, a resistance element and a transistor in a flip chip structure.
Figure 14:
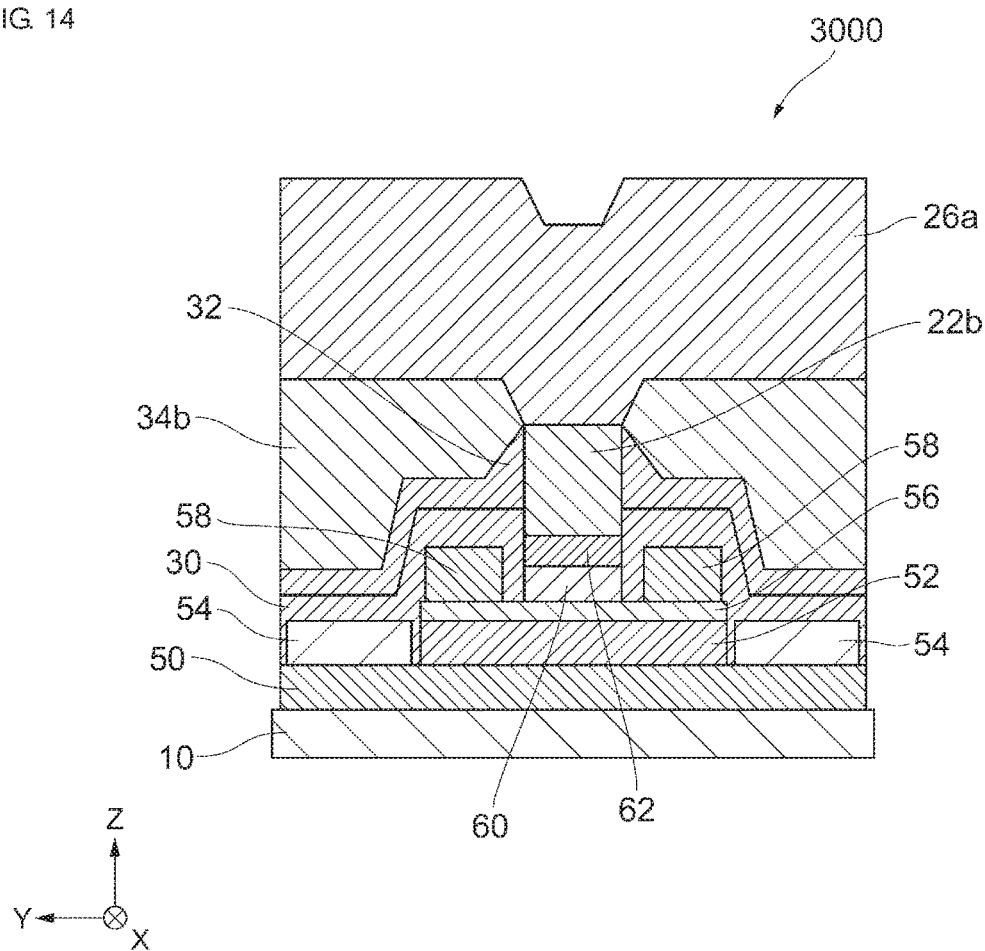
FIG. 14 is a sectional view taken along line 8-8 of FIG. 13.
Figure 15:
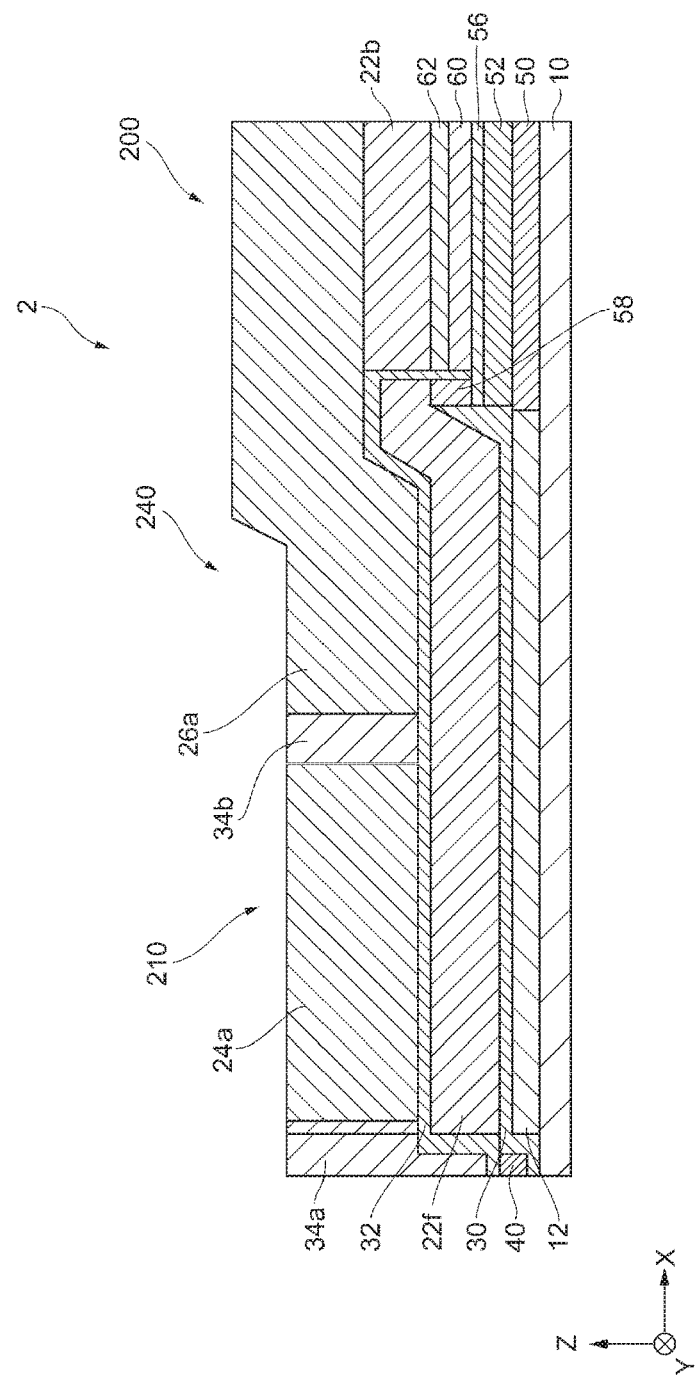
FIG. 15 illustrates an example of the sectional structure of capacitors, a resistance element and a transistor in a case where one of the capacitors is formed of the parasitic capacitance of a wiring line.

FIGS. 13 to 15 illustrate example configurations of the capacitors 210 and 240, the resistance element 270 and the transistor 200 in a case where the power amplification circuit is mounted using a flip chip structure. Here, FIG. 13 illustrates a plan view and a sectional view taken along line 7-7 of an example configuration (comparative example 3) of the capacitor 210, the resistance element 270 and the transistor 200 in a flip chip structure. FIG. 14 is a sectional view taken along line 8-8 of FIG. 13. FIG. 15 illustrates an example of the cross sectional structure of the capacitors 210 and 240, the resistance element 270 and the transistor 200 in the case where the capacitor 240 is formed of the parasitic capacitance of a wiring line.

In contrast to the power amplification circuit 1000 illustrated in FIG. 9, the comparative example 3 (power amplification circuit 3000) illustrated in FIGS. 13 and 14 includes a metal layer 22f instead of the metal layer 22a and includes a metal layer 26a, which is for bump connection, instead of the metal layer 24c.

The metal layer 26a is provided on the metal layer 22b on the transistor side and is formed so as to be led out to the capacitor side (negative side in X axis direction) (refer to FIG. 13), for example. Here, a parasitic capacitance can be generated between the led out part of the metal layer 26a and the part of the metal layer 22f that is led out in order to be connected to the base electrode 58. Therefore, in order to avoid generation of this parasitic capacitance, typically, an insulating layer 34b is provided between the metal layer 26a and the metal layer 22f (refer to FIG. 13).

On the other hand, in a power amplification circuit 2 illustrated in FIG. 15, in contrast to the power amplification circuit 3000 illustrated in FIG. 13, the insulating layer 34b between the metal layer 26a and the metal layer 22f is removed and the metal layer 26a is formed. Thus, a prescribed parasitic capacitance is intentionally generated between the metal layer 26a and the metal layer 22f (refer to FIG. 15). Therefore, charge accumulates between the metal layer 26a electrically connected to the emitter layer 60 and the metal layer 22f electrically connected to the base layer 56 and the capacitor 240 (base-emitter capacitor) is formed.

In the above-described configuration, for example, the step of providing the insulating layer 34b in the power amplification circuit 3000 is omitted and the power amplification circuit 2 can be formed by providing the metal layer 26a directly on top of the insulating layer 32. Therefore, the capacitor 240 (base-emitter capacitor) can be newly formed with there being substantially no change from the arrangement of the capacitor 210 (DC cut capacitor) in the power amplification circuit 3000. Therefore, with the power amplification circuit 2, the power adding efficiency can be improved while suppressing an increase in circuit area caused by increasing the number of capacitors. The size of the parasitic capacitance can be appropriately changed by setting the length of wiring lines, the separation of the wiring lines, and so forth.

Simulation Results

Next, the improvement in power adding efficiency achieved with the configuration of the power amplifier 160B will be described on the basis of simulation results while referring to FIGS. 16 to 20.

Figure 16:
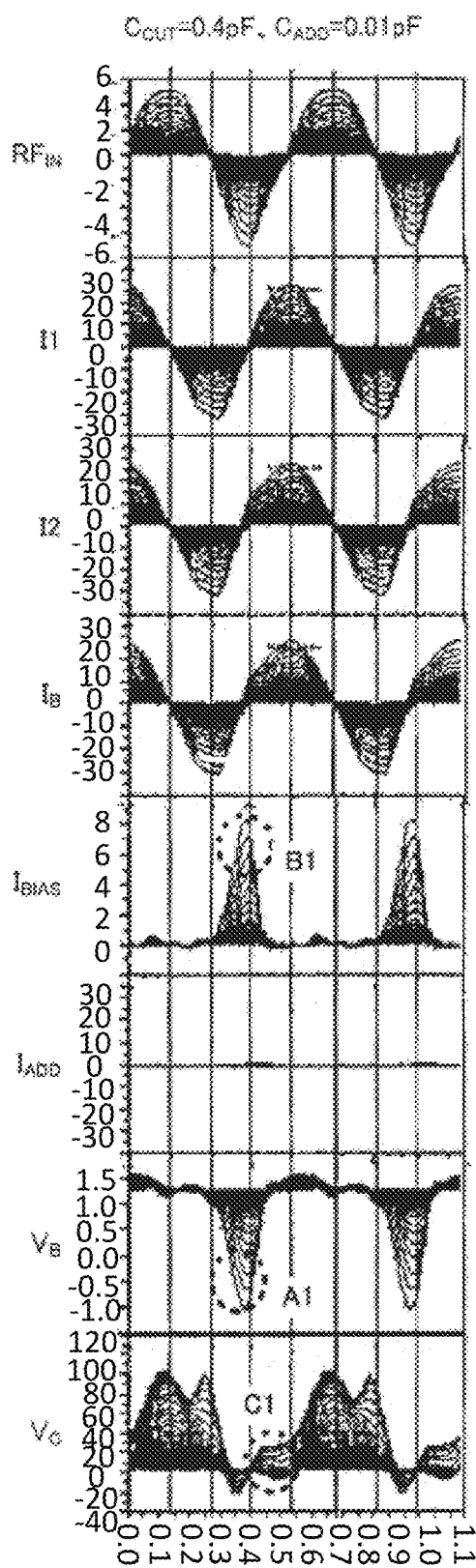
FIG. 16 illustrates simulation results for a case where the capacitance value of one capacitor is 0.4 pF and the capacitance value of another capacitor is 0.01 pF.

FIG. 16 illustrates simulation results for a case where the capacitance value $C_{CUT}$ of the capacitor 210 is 0.4 pF and the capacitance value $C_{ADD}$ of the capacitor 240 is 0.01 pF. $C_{ADD}$=0.01 pF is a value that is so small that the capacitor 240 can be ignored. In other words, FIG. 16 illustrates simulation results that are the same as those that would be obtained in a case where the capacitor 240 is not provided.

In FIG. 16, the horizontal axis represents time and the vertical axis represents the eight parameters illustrated in FIG. 4. $RF_{IN}$ represents the voltage of the RF signal input to the capacitor 210. I1 represents the current output from the capacitor 210. I2 represents a current obtained when $I_{BIAS}$ is added to I1. $I_B$ represents the base current of the transistor 200. $I_{BIAS}$ represents the bias current output from the bias circuit 220. represents the current that flows to the capacitor 240. $V_B$ represents the base voltage of the transistor 200. $V_C$ represents the collector voltage of the transistor 200. Here, when the region in which the waveforms of the collector voltage $V_C$ and the collector current $I_C$ of the transistor 200 overlap becomes larger, power consumption (=$V_C \times I_C$) increases and the power adding efficiency of the power amplifier 160A falls.

As illustrated by point A1 in FIG. 16, at the time of a large output (that is, when the $V_C$ amplitude level is large), the base voltage $V_B$ falls by a large amount when the transistor 200 turns off. At the same time, the bias current $I_{BIAS}$ increases, as illustrated by point B1. When the bias current $I_{BIAS}$ increases, the timing at which the collector voltage $V_C$ rises becomes earlier, as illustrated by point C1. Thus, a region in which the waveforms of the collector voltage $V_C$ and the collector current $I_C$ overlap becomes larger and current consumption increases. In other words, in the case where the capacitor 240 is not provided, it is clear that the power adding efficiency falls at the time of a large output.

Figure 17:
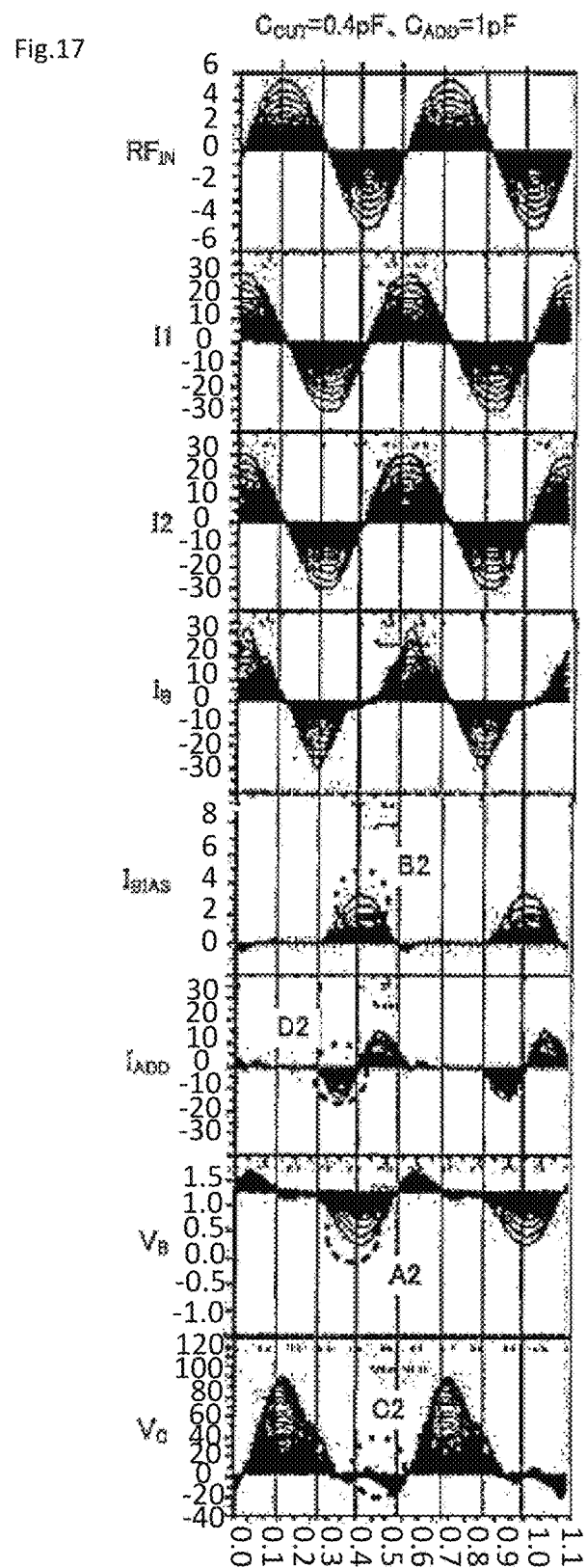
FIG. 17 illustrates simulation results for a case where the capacitance value of the one capacitor is 0.4 pF and the capacitance value of the other capacitor is 1 pF.

FIG. 17 illustrates simulation results for a case where the capacitance value $C_{CUT}$ of the capacitor 210 is 0.4 pF and the capacitance value $C_{ADD}$ of the capacitor 240 is 1 pF. The horizontal axis and the vertical axis in FIG. 17 represent the same parameters as in FIG. 16.

As illustrated by point D2 in FIG. 17, when the transistor 200 turns off, a current (negative current $I_{ADD}$) flows to the base of the transistor 200 from the capacitor 240. As a result of this current, as illustrated by point A2, the size of the fall in the base voltage $V_B$ at the time of a large output becomes smaller than in the case illustrated in FIG. 16. At the same time, as illustrated by point B2, the size of the increase of the bias current $I_{BIAS}$ also becomes smaller than in the case illustrated in FIG. 16. Therefore, as illustrated by point C2, compared to the case illustrated in FIG. 16, it is possible to suppress the situation in which the timing at which the collector voltage $V_C$ rises becomes earlier. Thus, in the case where the capacitor 240 is provided, the region in which the waveforms of the collector voltage $V_C$ and the collector current $I_C$ overlap becomes smaller. In other words, it is clear that the power adding efficiency at the time of a large output is improved.

Figure 18:
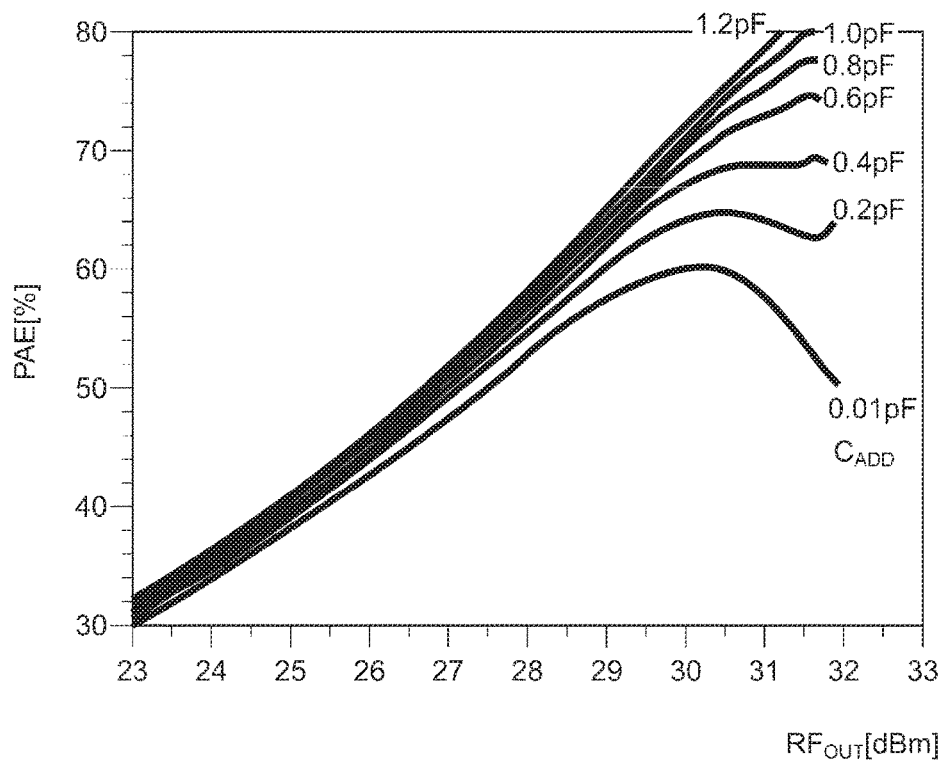
FIG. 18 illustrates simulation results that depict an example of the relationship between the capacitance value of a capacitor and power adding efficiency in a power amplifier.

FIG. 18 illustrates simulation results that depict an example of the relationship between the capacitance value $C_{ADD}$ of the capacitor 240 and the power adding efficiency of the power amplifier 160B. In FIG. 18, the horizontal axis represents output power level (dBm) and the vertical axis represents power adding efficiency (%). As illustrated in FIG. 18, in the case where the capacitor 240 is not provided (case where $C_{ADD}$=0.01 pF), the power adding efficiency begins to fall by a large amount around an output level of 30 Bm. In contrast, the fall in the power adding efficiency at the time of a large output can be suppressed by adding the capacitor 240. In particular, in the examples illustrated in FIG. 18, the power adding efficiency at the time of a large output is greatly improved by setting the capacitance value $C_{ADD}$ to around 0.8 pF to 1.2 pF (substantially the same as the capacitance value of transistor 200 when transistor 200 is off).

Figure 19:
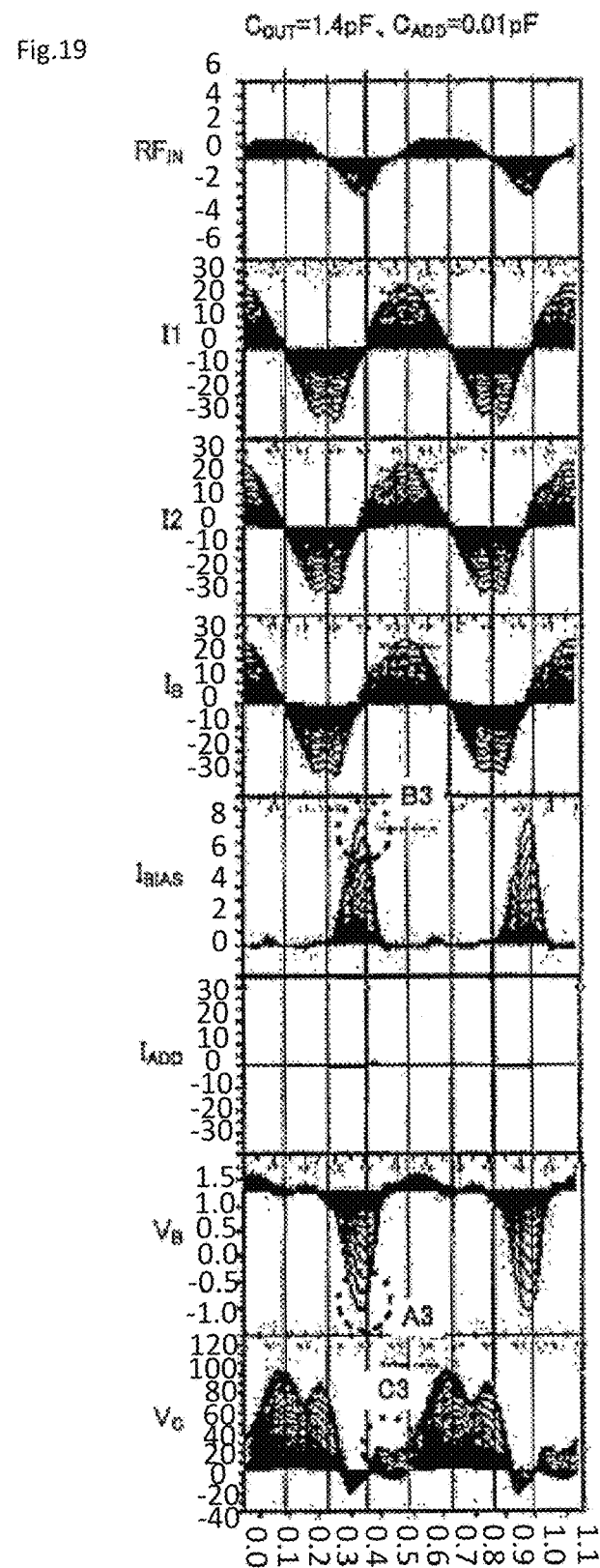
FIG. 19 illustrates simulation results for a case where the capacitance value of one capacitor is 1.4 pF and the capacitance value of another capacitor is 0.01 pF.

Next, simulation results will be described for a case in which the capacitance value $C_{CUT}$ of the capacitor 210 is made large in order to make it possible to handle RF signals over a wide frequency band. FIG. 19 illustrates simulation results for a case where the capacitance value $C_{CUT}$ of the capacitor 210 is 1.4 pF and the capacitance value $C_{ADD}$ of the capacitor 240 is 0.01 pF. The horizontal axis and the vertical axis in FIG. 19 represent the same parameters as in FIG. 16.

As illustrated by point A3 in FIG. 19, at the time of a large output, the base voltage $V_B$ falls by a large amount when the transistor 200 turns off. At the same time, the bias current $I_{BIAS}$ increases, as illustrated by point B3. When the bias current $I_{BIAS}$ increases, the timing at which the collector voltage $V_C$ rises becomes earlier, as illustrated by point C3. Thus, the region in which the waveforms of the collector voltage $V_c$ and the collector current IC overlap becomes larger. In other words, in the case where the capacitor 240 is not provided, it is clear that the power adding efficiency falls at the time of a large output.

Figure 20:
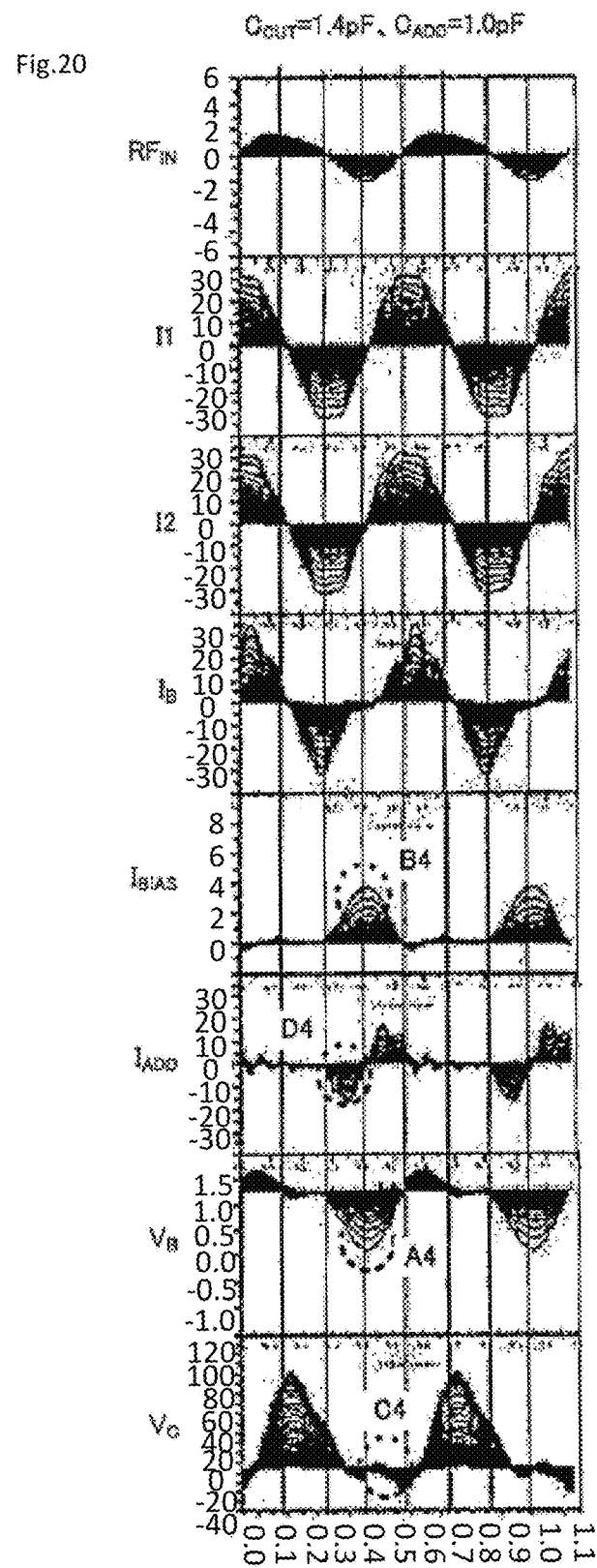
FIG. 20 illustrates simulation results for a case where the capacitance value of one capacitor is 1.4 pF and the capacitance value of another capacitor is 1 pF.

FIG. 20 illustrates simulation results for a case where the capacitance value $C_{CUT}$ of the capacitor 210 is 1.4 pF and the capacitance value $C_{ADD}$ of the capacitor 240 is 1 pF. The horizontal axis and the vertical axis in FIG. 20 represent the same parameters as in FIG. 16.

As illustrated by point D4 in FIG. 20, when the transistor 200 turns off, a current (negative current $I_{ADD}$) flows to the base of the transistor 200 from the capacitor 240. As a result of this current, as illustrated by point A4, the size of the fall in the base voltage $V_B$ at the time of a large output becomes smaller than in the case illustrated in FIG. 19. At the same time, as illustrated by point B4, the size of the increase of the bias current $I_{BIAS}$ also becomes smaller than in the case illustrated in FIG. 19. Therefore, as illustrated by point C4, compared to the case illustrated in FIG. 19, it is possible to suppress the situation in which the timing at which the collector voltage $V_C$ rises becomes earlier. Thus, in the case where the capacitor 240 is provided, the region in which the waveforms of the collector voltage $V_C$ and the collector current $I_C$ overlap becomes smaller. In other words, it is clear that the power adding efficiency at the time of a large output is improved. Thus, it is clear that the power adding efficiency is improved by providing the capacitor 240 irrespective of the capacitance value of the capacitor 210.

Second Application Example

Figure 21:
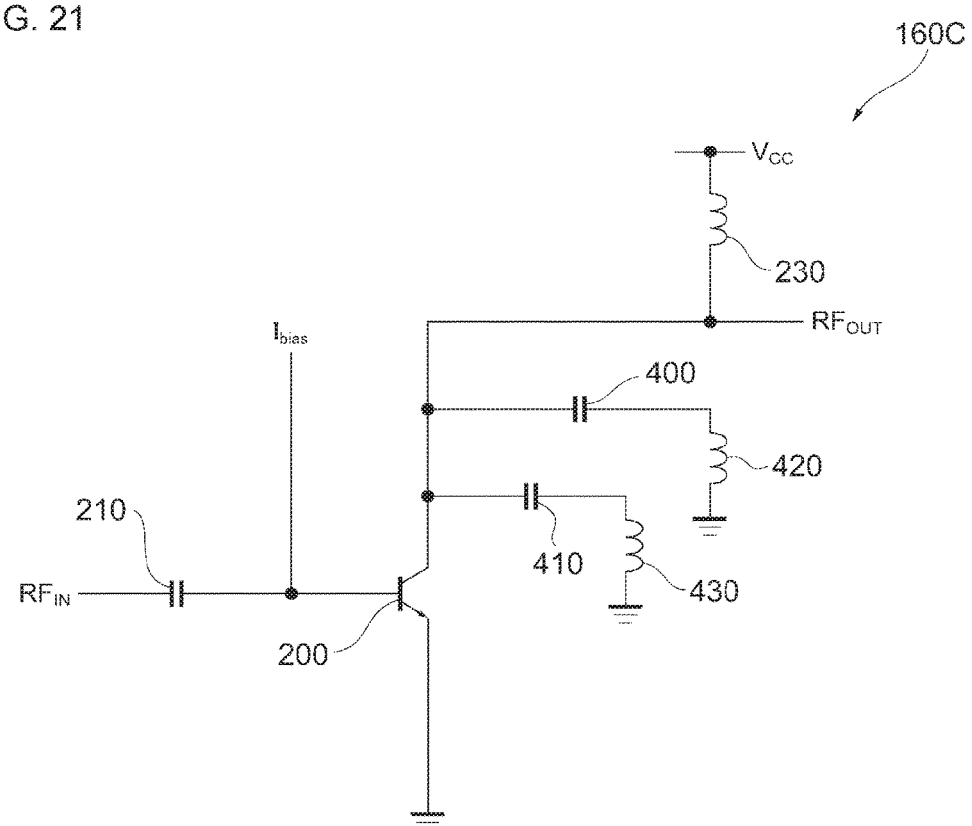
FIG. 21 illustrates an example configuration of a power amplifier included in the power amplification circuit according to an embodiment of the present disclosure.

FIG. 21 illustrates an example configuration of the power amplifier 160 (power amplifier 160C) included in a power amplification circuit according to an embodiment of the present disclosure. The power amplifier 160C is not equipped with the capacitor 240 of the power amplifier 160A and includes capacitors 400 and 410 and inductors 420 and 430.

One end (second metal layer) of the capacitor 400 (first capacitor) is connected to the collector of the transistor 200 and the other end (first metal layer) of the capacitor 400 is grounded via the inductor 420. One end (second metal layer) of the capacitor 410 (second capacitor) is connected to the collector of the transistor 200 and the other end (third metal layer) of the capacitor 410 is grounded via the inductor 430. One end of the inductor 420 and one end of the inductor 430 are respectively connected to the other ends of the capacitors 400 and 410 and the other ends of the inductors 420 and 430 are grounded.

The capacitor 400 and the inductor 420 form a harmonic termination circuit having a resonant frequency that is around M times (M: natural number) the frequency of the amplified signal $RF_{OUT}$, which is obtained through the amplification performed by the transistor 200. Thus, the capacitor 400 and the inductor 420 can control the impedance of a substantially M-th order harmonic (for example, second-order harmonic) (first harmonic) of the amplified signal $RF_{OUT}$ so as to be short-circuited.

Similarly, the capacitor 410 and the inductor 430 form a harmonic termination circuit having a resonant frequency that is around N times (N: natural number) the frequency of the amplified signal $RF_{OUT}$ which is obtained through the amplification performed by the transistor 200. Thus, the capacitor 410 and the inductor 430 can control the impedance of a substantially N-th order harmonic (for example, fourth-order harmonic) (second harmonic) of the amplified signal $RF_{OUT}$ so as to be short-circuited. Therefore, the two harmonic termination circuits can remove the harmonics from the amplified signal $RF_{OUT}$ by short circuiting the harmonics of the amplified signal $RF_{OUT}$.

The harmonics to be short circuited in the harmonic termination circuits (for example, second-order harmonic, fourth-order harmonic) are not limited to even-order harmonics and may instead be odd-order harmonics (for example, third order, fifth order).

In this configuration as well, it is possible to apply the multilayer capacitor element to the two capacitors 400 and 410 in the power amplifier 160C. Therefore, the number of capacitors can be increased and harmonics can be removed from the amplified signal $RF_{OUT}$ while suppressing an increase in the circuit area of the power amplification circuit.

Third Application Example

Figure 22:
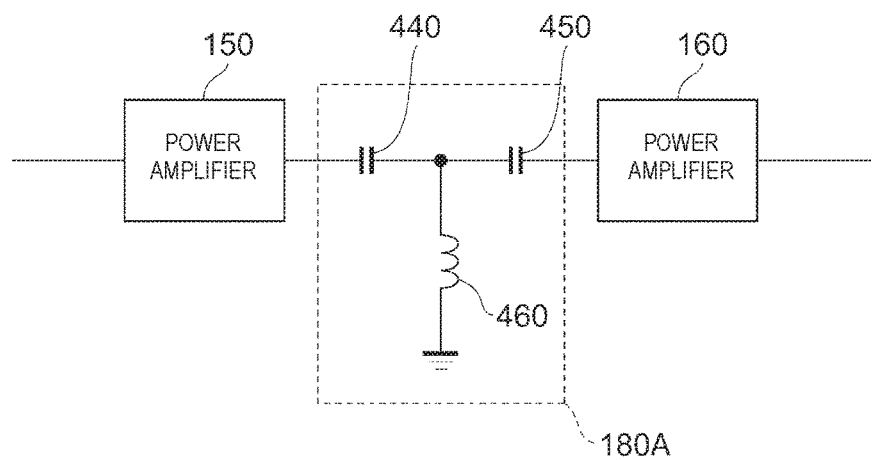
FIG. 22 illustrates an example configuration of a matching network included in the power amplification circuit according to the embodiment of the present disclosure.

FIG. 22 illustrates an example configuration of the matching network 180 (matching network 180A) included in a power amplification circuit according to an embodiment of the present disclosure. A matching network 180A includes capacitors 440 and 450 and an inductor 460.

One end (first metal layer) of the capacitor 440 (first capacitor) is connected to an output terminal of the power amplifier 150 (first amplifier) and the other end (second metal layer) of the capacitor 440 is connected to one end of the inductor 460. One end (second metal layer) of the capacitor 450 (second capacitor) is connected to the one end of the inductor 460 and the other end (third metal layer) of the capacitor 450 is connected to an input terminal of the power amplifier 160 (second amplifier). The one end of the inductor 460 is connected to a connection point between the capacitor 440 and the capacitor 450 and the other end of the inductor 460 is grounded.

The capacitors 440 and 450 and the inductor 460 form the matching network 180A that matches the impedances between the power amplifier 150 and the power amplifier 160.

In this configuration as well, the multilayer capacitor element can be applied to the two capacitors 440 and 450 in the matching network 180A. Therefore, the number of capacitors can be increased and the impedances can be matched between two amplifiers while suppressing an increase in the circuit area of the power amplification circuit.

A matching network to which this configuration can be applied is not limited to the matching network 180A and the configuration may be applied to any matching network that includes two serially connected capacitors. For example, the configuration may be applied to the matching networks 170 and 190 illustrated in FIG. 3.

Embodiments of the present disclosure have been described above. The power amplifiers 160A (refer to FIGS. 4) and 160B (refer to FIG. 6) can be formed using a multilayer capacitor element in which the three metal layers 20, 22 and 24 form a multilayer structure for the capacitor 210, which has one end connected to the base of the transistor 200 and has the RF signal $RF_{IN}$ supplied to the other end thereof, and the capacitor 240, which has one end connected to the base of the transistor 200 and the other end connected to the emitter of the transistor 200. Therefore, it is possible to increase the number of capacitors while suppressing an increase in the circuit area of the power amplification circuit. In addition, the power adding efficiency of the power amplifiers 160A and 160B at the time of a large output can be improved.

Furthermore, as illustrated in FIGS. 7 and 11, the electrical connection between the other end of the capacitor 240 and the emitter of the transistor 200 can be formed of a through electrode in the power amplification circuits 1A and 1B. However, the connection is not limited to this configuration.

In addition, in the power amplifier 160C (refer to FIG. 21), the capacitors 400 and 410, one ends of which are connected to the collector of the transistor 200 and the other ends of which are respectively connected to the inductors 420 and 430, can be formed using a multilayer capacitor element. Thus, harmonics can be removed from the amplified signal $RF_{out}$ while suppressing an increase in circuit area.

Furthermore, in the matching network 180A (refer to FIG. 22), the capacitor 440, which has one end connected to the output terminal of the power amplifier 150 and the other end connected to one end of the inductor 460, and the capacitor 450, which has one end connected to the one end of the inductor 460 and the other end connected to the input terminal of the power amplifier 160, can be formed using a multilayer capacitor element. Thus, the impedances can be matched between the power amplifiers 150 and 160 while suppressing an increase in circuit area.

In the embodiments, the bias circuit 220 is an emitter follower circuit formed using the transistor 250, but the configuration of the bias circuit 220 is not limited to this configuration. Specifically, provided that the bias circuit 220 is a circuit in which the bias current $I_{BIAS}$ increases as the base voltage $V_B$ of the transistor 200 falls, any suitable configuration can be adopted.

Furthermore, in the embodiments, an example has been described in which the capacitor 240 is provided in the power amplifier 160, which is the power stage of the power amplification module 120, but the same configuration as the power amplifier 160 may also be adopted for the power amplifier 150, which is the drive-stage of the power amplification module 120. The same configuration may also be adopted when there are three or more power amplifiers.

In addition, in the present specification, power amplifiers and matching networks have been used as examples of circuits to which the present disclosure is applied, but circuits to which the present disclosure can be applied are not limited to power amplifiers or matching networks. For example, the present disclosure can also be similarly applied to other circuits in which two capacitors are connected in series.

The purpose of the embodiments described above is to enable easy understanding of the present disclosure and the embodiments are not to be interpreted as limiting the present disclosure. The present disclosure can be changed or improved without departing from the gist of the disclosure and equivalents to the present disclosure are also included in the present disclosure. In other words, appropriate design changes made to the embodiments by a person skilled in the art are included in the scope of the present disclosure so long as the changes have the characteristics of the present disclosure. For example, the elements included in the embodiments and the arrangements, materials, conditions, shapes, sizes and so forth of the elements are not limited to those exemplified in the embodiments and can be appropriately changed. In addition, each embodiment is merely an illustrative example and it goes without saying that parts of the configurations illustrated in different embodiments can be substituted or combined with each other and these new configurations are also included in the scope of the present disclosure so long as the configurations have the characteristics of the present disclosure.

While preferred embodiments of the disclosure have been described above, it is to be understood that variations and modifications will be apparent to those skilled in the art without departing from the scope and spirit of the disclosure. The scope of the disclosure, therefore, is to be determined solely by the following claims.

What is claimed is:

1. A power amplification circuit comprising:
    a capacitor element in which a first metal layer, a first insulating layer, a second metal layer, a second insulating layer and a third metal layer are sequentially stacked,
    the capacitor element including
        a first capacitor in which the first metal layer serves as a first electrode thereof and the second metal layer serves as a second electrode thereof, and
        a second capacitor in which the second metal layer serves as a first electrode thereof and the third metal layer serves as a second electrode thereof; and
    a transistor that amplifies a radio-frequency signal;
    wherein the second electrode of the first capacitor and the first electrode of the second capacitor are connected to a collector of the transistor,
    a first harmonic is output from the first electrode of the first capacitor, the first harmonic having a frequency that is around M times a frequency of the radio-frequency signal, where M is a natural number, and
    a second harmonic is output from the second electrode of the second capacitor, the second harmonic having a frequency that is around N times the frequency of the radio-frequency signal, where N is a natural number.

* * * * *